United States Patent
Kim et al.

(10) Patent No.: US 10,790,292 B2
(45) Date of Patent: Sep. 29, 2020

(54) METHOD OF MAKING EMBEDDED MEMORY DEVICE WITH SILICON-ON-INSULATOR SUBSTRATE

(71) Applicant: Silicon Storage Technology, Inc., San Jose, CA (US)

(72) Inventors: Jinho Kim, Saratoga, CA (US); Xian Liu, Sunnyvale, CA (US); Feng Zhou, Fremont, CA (US); Parviz Ghazavi, San Jose, CA (US); Steven Lemke, Boulder Creek, CA (US); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 39 days.

(21) Appl. No.: 16/057,749

(22) Filed: Aug. 7, 2018

(65) Prior Publication Data

US 2019/0348427 A1 Nov. 14, 2019

Related U.S. Application Data

(60) Provisional application No. 62/671,343, filed on May 14, 2018.

(51) Int. Cl.
*H01L 27/11521* (2017.01)
*H01L 21/027* (2006.01)
(Continued)

(52) U.S. Cl.
CPC .. *H01L 27/11536* (2013.01); *H01L 21/32055* (2013.01); *H01L 21/32133* (2013.01); *H01L 21/84* (2013.01); *H01L 27/11521* (2013.01); *H01L 27/1207* (2013.01); *H01L 29/0847* (2013.01); *H01L 29/40114* (2019.08); *H01L 29/42328* (2013.01); *H01L 29/66545* (2013.01); *H01L 21/0274* (2013.01); *H01L 21/26513* (2013.01); *H01L 21/31053* (2013.01); *H01L 21/3212* (2013.01); *H01L 29/6656* (2013.01)

(58) Field of Classification Search
CPC .......... H01L 27/11536; H01L 27/1207; H01L 21/84; H01L 21/32055; H01L 21/32133; H01L 29/66545; H01L 27/11521; H01L 29/42328
USPC ......... 257/316, 314, 315; 438/201, 211, 257
See application file for complete search history.

(56) References Cited

U.S. PATENT DOCUMENTS

| | | |
|---|---|---|
| 4,771,016 A | 9/1988 | Bajor |
| 5,061,642 A | 10/1991 | Fujioka |

(Continued)

*Primary Examiner* — Thinh T Nguyen
(74) *Attorney, Agent, or Firm* — DLA Piper LLP (US)

(57) ABSTRACT

A method of forming a semiconductor device where memory cells and some logic devices are formed on bulk silicon while other logic devices are formed on a thin silicon layer over insulation over the bulk silicon of the same substrate. The memory cell stacks, select gate poly, and source regions for the memory devices are formed in the memory area before the logic devices are formed in the logic areas. The various oxide, nitride and poly layers used to form the gate stacks in the memory area are formed in the logic areas as well. Only after the memory cell stacks and select gate poly are formed, and the memory area protected by one or more protective layers, are the oxide, nitride and poly layers used to form the memory cell stacks removed from the logic areas, and the logic devices are then formed.

5 Claims, 31 Drawing Sheets

Memory Area – BL Direction

(51) Int. Cl.
*H01L 27/11536* (2017.01)
*H01L 29/66* (2006.01)
*H01L 27/12* (2006.01)
*H01L 21/84* (2006.01)
*H01L 21/3205* (2006.01)
*H01L 21/3213* (2006.01)
*H01L 29/08* (2006.01)
*H01L 29/423* (2006.01)
*H01L 21/28* (2006.01)
H01L 21/3105 (2006.01)
H01L 21/265 (2006.01)
H01L 21/321 (2006.01)

(56) References Cited

U.S. PATENT DOCUMENTS

| | | |
|---|---|---|
| 5,417,180 A | 5/1995 | Nakamura |
| 5,888,297 A | 3/1999 | Ogura |
| 6,747,310 B2 | 6/2004 | Fan et al. |
| 7,868,375 B2 | 1/2011 | Liu et al. |
| 7,927,994 B1 | 4/2011 | Liu et al. |
| 9,276,005 B1 | 3/2016 | Zhou et al. |
| 9,431,407 B2 | 8/2016 | Su et al. |
| 2009/0108314 A1 | 4/2009 | Cai et al. |
| 2015/0253040 A1 | 9/2015 | Su et al. |
| 2018/0047738 A1* | 2/2018 | Richter et al. .... H01L 27/11546 |

* cited by examiner

Memory Area – CG Direction

Memory Area – BL Direction

First Logic Area

Second Logic Area

Memory Area – CG Direction

Memory Area – BL Direction

First Logic Area

Second Logic Area

Memory Area – CG Direction

Memory Area – BL Direction

First Logic Area

Second Logic Area

Memory Area – CG Direction

Memory Area – BL Direction

First Logic Area

Second Logic Area

Memory Area – CG Direction

Memory Area – BL Direction

First Logic Area

Second Logic Area

Memory Area – CG Direction

Memory Area – BL Direction

First Logic Area

Second Logic Area

Memory Area – CG Direction

Memory Area – BL Direction

First Logic Area

Second Logic Area

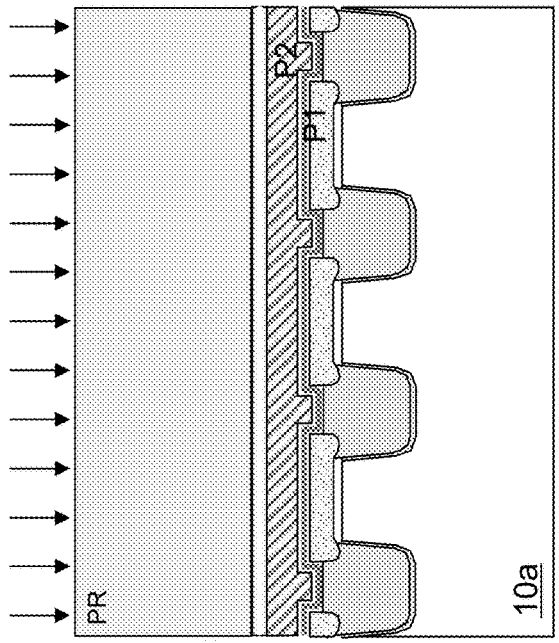
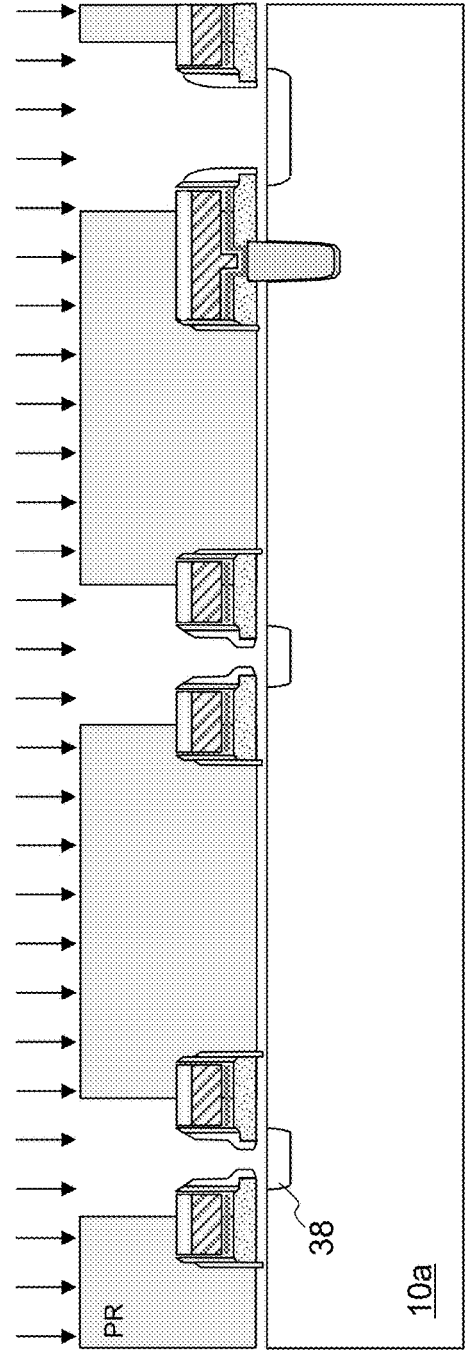
FIG. 9A
Memory Area – CG Direction
FIG. 9B
Memory Area – BL Direction First Logic Area Second Logic Area Memory Area – CG Direction Memory Area – BL Direction First Logic Area Second Logic Area Memory Area – CG Direction Memory Area – BL Direction First Logic Area Second Logic Area Memory Area – CG Direction Memory Area – BL Direction First Logic Area Second Logic Area Memory Area – CG Direction Memory Area – BL Direction

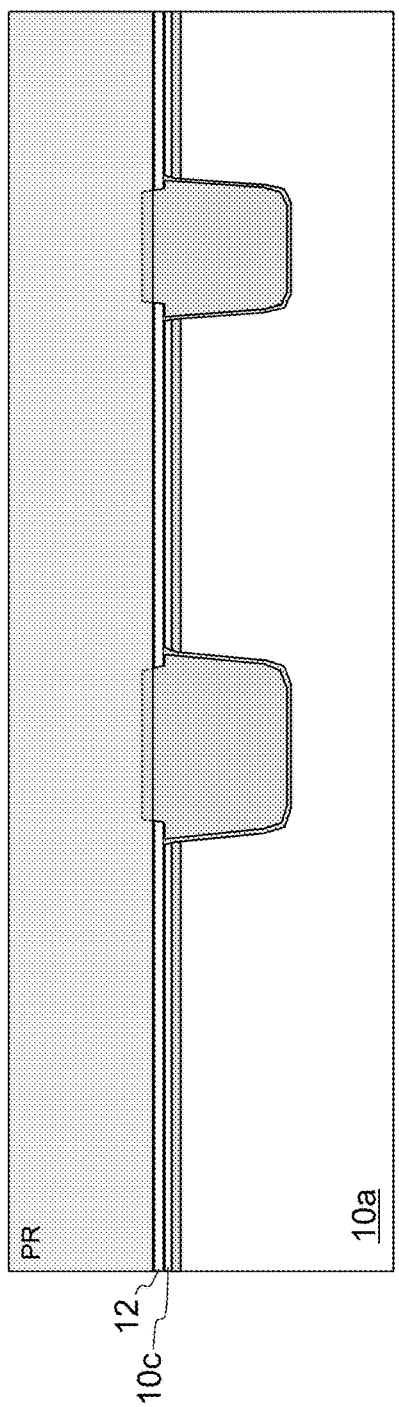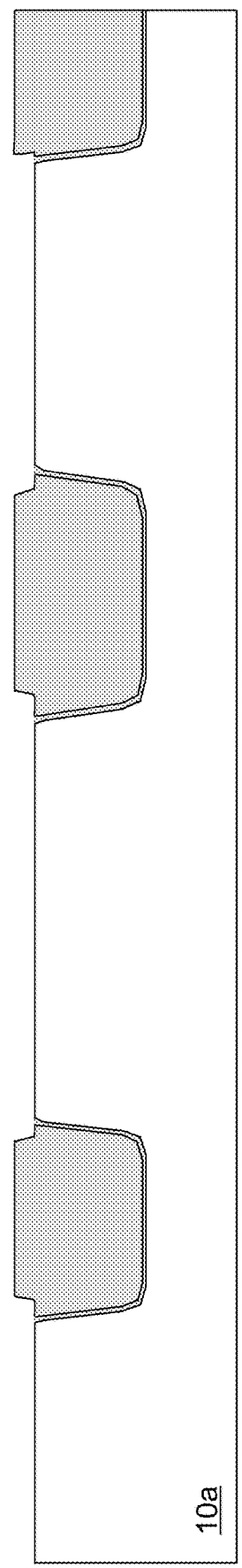

Memory Area – CG Direction

Memory Area – BL Direction

First Logic Area

Second Logic Area

Memory Area – CG Direction

Memory Area – BL Direction

First Logic Area

Second Logic Area

Memory Area – CG Direction

Memory Area – BL Direction

First Logic Area

Second Logic Area

METHOD OF MAKING EMBEDDED MEMORY DEVICE WITH SILICON-ON-INSULATOR SUBSTRATE

RELATED APPLICATIONS

This application claims the benefit of U.S. Provisional Application No. 62/671,343 filed on May 14, 2018, and which is incorporated herein by reference.

FIELD OF THE INVENTION

The present invention relates to embedded non-volatile memory devices.

BACKGROUND OF THE INVENTION

Non-volatile memory devices formed on bulk silicon semiconductor substrates are well known. For example, U.S. Pat. Nos. 6,747,310, 7,868,375 and 7,927,994 disclose memory cells with four gates (floating gate, control gate, select gate and erase gate) formed on a bulk semiconductor substrate. Source and drain regions are formed as diffusion implant regions into the substrate, defining a channel region therebetween in the substrate. The floating gate is disposed over and controls a first portion of the channel region, the select gate is disposed over and controls a second portion of the channel region, the control gate is disposed over the floating gate, and the erase gate is disposed over the source region. Bulk substrates are ideal for these type of memory devices because deep diffusions into the substrate can be used for forming the source and drain region junctions.

Silicon on insulator (SOI) devices are well known in the art of microelectronics. SOI devices differ from bulk silicon substrate devices in that the substrate is layered with an embedded insulating layer under the silicon surface (i.e. silicon-insulator-silicon) instead of being solid silicon. With SOI devices, the silicon junctions are formed in a thin silicon layer disposed over the electrical insulator that is embedded in the silicon substrate. The insulator is typically silicon dioxide (oxide). This substrate configuration reduces parasitic device capacitance, thereby improving performance. SOI substrates can be manufactured by SIMOX (separation by implantation of oxygen using an oxygen ion beam implantation—see U.S. Pat. Nos. 5,888,297 and 5,061,642), wafer bonding (bonding oxidized silicon with a second substrate and removing most of the second substrate—see U.S. Pat. No. 4,771,016), or seeding (topmost silicon layer grown directly on the insulator—see U.S. Pat. No. 5,417,180).

Finally, it is known to form core logic devices such as high voltage, input/output and/or analog devices on the same substrate as non-volatile memory devices (i.e. typically referred to as embedded memory devices), where the core logic devices are formed in a first substrate area having a SOI configuration, and memory devices are formed in a second substrate area having a bulk silicon configuration. See for example U.S. Pat. No. 9,431,407. However, certain gate structure advances are incompatible with the conventional methods of making such a composite structure, because certain processing steps in forming the memory cells adversely affect the formation of the logic devices, and vice versa.

BRIEF SUMMARY OF THE INVENTION

The aforementioned problems and needs are addressed by a method of forming a semiconductor device that includes:
providing a substrate that includes bulk silicon, a first insulation layer directly over the bulk silicon, and a silicon layer directly over the first insulation layer;
removing the silicon layer and the first insulation layer from a first area of the substrate, while maintaining the first insulation layer and the silicon layer in a second area of the substrate;
forming a first polysilicon layer disposed over and insulated from the bulk silicon in the first area of the substrate and over and insulated from the silicon layer in the second area of the substrate;
forming a second polysilicon layer disposed over and insulated from the first polysilicon layer in the first and second areas of the substrate;
performing one or more etches to selectively remove portions of the first and second polysilicon layers in the first area of the substrate while maintaining the first and second polysilicon layers in the second area of the substrate, wherein the one or more etches result in pairs of spaced apart stack structures of the first and second polysilicon layers in the first area of the substrate;
forming first source regions in the bulk silicon in the first area of the substrate each disposed between one of the pairs of stack structures;
forming a third polysilicon layer disposed over and insulated from the bulk silicon in the first area of the substrate and disposed between the stack structures;
forming one or more protective layers in the first area of the substrate over the stack structures and the third polysilicon layer;
after the forming of the one or more protective layers in the first area of the substrate, removing the first and second polysilicon layers from the second area of the substrate;
after the removing of the first and second polysilicon layers from the second area of the substrate, forming logic devices in the second area of the substrate, wherein the forming of each of the logic devices includes:
    forming spaced apart second source and first drain regions in the silicon layer, and
    forming a conductive gate over and insulated from a portion of the silicon layer between the second source and first drain regions;
after the forming of the logic devices, removing the one or more protective layers in the first area of the substrate;
etching portions of the third polysilicon layer in the first area of the substrate to form a plurality of blocks of the third polysilicon layer each disposed adjacent to one of the stack structures; and
forming second drain regions in the bulk silicon in the first area of the substrate, wherein each second drain region is disposed adjacent to one of the blocks of the third polysilicon layer.

A method of forming a semiconductor device includes:
providing a substrate that includes bulk silicon, a first insulation layer directly over the bulk silicon, and a silicon layer directly over the first insulation layer;
removing the silicon layer and the first insulation layer from a first area of the substrate, while maintaining the first insulation layer and the silicon layer in a second area of the substrate and a third area of the substrate;
forming a first polysilicon layer disposed over and insulated from the bulk silicon in the first area of the substrate and over and insulated from the silicon layer in the second and third areas of the substrate;
forming a second polysilicon layer disposed over and insulated from the first polysilicon layer in the first, second and third areas of the substrate;

performing one or more etches to selectively remove portions of the first and second polysilicon layers in the first area of the substrate while maintaining the first and second polysilicon layers in the second and third areas of the substrate, wherein the one or more etches result in pairs of spaced apart stack structures of the first and second polysilicon layers in the first area of the substrate;

forming first source regions in the bulk silicon in the first area of the substrate each disposed between one of the pairs of stack structures;

forming a third polysilicon layer disposed over and insulated from the bulk silicon in the first area of the substrate and disposed between the stack structures;

forming one or more protective layers in the first area of the substrate over the stack structures and the third polysilicon layer;

after the forming of the one or more protective layers in the first area of the substrate, removing the first and second polysilicon layers from the second and third areas of the substrate;

after the removing of the first and second polysilicon layers from the second and third areas of the substrate, removing the silicon layer and the first insulation layer from the third area of the substrate;

after the removing of the first and second polysilicon layers from the second area of the substrate, forming first logic devices in the second area of the substrate, wherein the forming of each of the first logic devices includes:
  forming spaced apart second source and first drain regions in the silicon layer, and
  forming a first conductive gate over and insulated from a portion of the silicon layer between the second source and first drain regions;

after the removing the silicon layer and the first insulation layer from the third area of the substrate, forming second logic devices in the third area of the substrate, wherein the forming of each of the second logic devices includes:
  forming spaced apart third source and second drain regions in the bulk silicon of the third area of the substrate, and
  forming a second conductive gate over and insulated from a portion of the bulk silicon between the third source and second drain regions;

after the forming of the first and second logic devices, removing the one or more protective layers in the first area of the substrate;

etching portions of the third polysilicon layer in the first area of the substrate to form a plurality of blocks of the third polysilicon layer each disposed adjacent to one of the stack structures; and forming third drain regions in the bulk silicon in the first area of the substrate, wherein each third drain region is disposed adjacent to one of the blocks of the third polysilicon layer.

A semiconductor device includes:
a substrate having:
  a first area of bulk silicon,
  a second area with a first insulation layer directly over bulk silicon and a silicon layer directly over the first insulation layer, and
  a third area of bulk silicon,
  wherein the first and third areas of the substrate lack any silicon layer disposed over insulation material;
memory cells formed in the first area, wherein each of the memory cells includes:
  spaced apart first source and first drain regions formed in the bulk silicon and defining a first channel region of the bulk silicon extending there between,
  a floating gate disposed over and insulated from a first portion of the first channel region,
  a select gate disposed over and insulated from a second portion of the first channel region,
  a control gate disposed over and insulated from the floating gate, and
  an erase gate disposed over and insulated from the first source region;
first logic devices formed in the second area, wherein each of the first logic devices includes:
  spaced apart second source and second drain regions formed in the silicon layer and defining a second channel region of the silicon layer extending there between, and
  a first conductive gate disposed over and insulated from the second channel region;
second logic devices formed in the third area, wherein each of the second logic devices includes:
  spaced apart third source and third drain regions formed in the bulk silicon and defining a third channel region of the bulk silicon extending there between, and
  a second conductive gate disposed over and insulated from the third channel region.

Other objects and features of the present invention will become apparent by a review of the specification, claims and appended figures.

BRIEF DESCRIPTION OF THE DRAWINGS

FIGS. 2A-16A are cross sectional views of the memory area (in the CG direction) showing the steps in forming the memory device.

FIGS. 2B-16B are cross sectional views of the memory area (in the BL direction) showing the steps in forming the memory device.

FIGS. 2C-16C are cross sectional views of the first logic area showing the steps in forming the memory device.

FIGS. 2D-16D are cross sectional views of the second logic area showing the steps in forming the memory device.

DETAILED DESCRIPTION OF THE INVENTION

The present invention is an improved method of forming an embedded memory device with non-volatile memory cells formed alongside core logic devices on an SOI substrate. The embedded insulator is removed from the memory area of the SOI substrate in which the non-volatile memory is formed, and from a second logic area, but maintained in a first logic area of the SOI substrate. The memory cells are formed in the memory area without adversely affecting the logic areas, and the logic devices are formed in the logic areas without adversely affecting the previously formed structures in the memory area.

Figure 1:
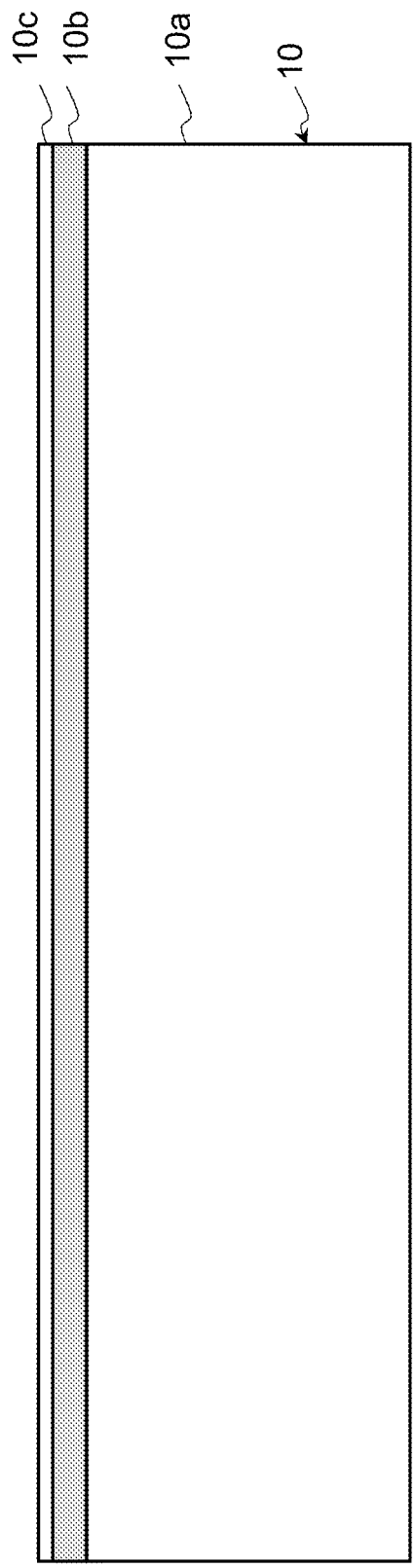
FIG. 1 is a cross sectional view showing the SOI substrate used in forming the memory device.

The process of forming embedded memory devices on an SOI substrate begins by providing an SOI substrate 10, as illustrated in FIG. 1. The SOI substrate includes three portions: bulk silicon 10a, a layer of insulating material 10b (e.g. oxide) over the silicon 10a, and a thin layer of silicon 10c over the insulator layer 10b. Forming SOI substrates is well known in the art as described above and in the U.S. patents identified above, and therefore is not further described herein.

Figure 2A:
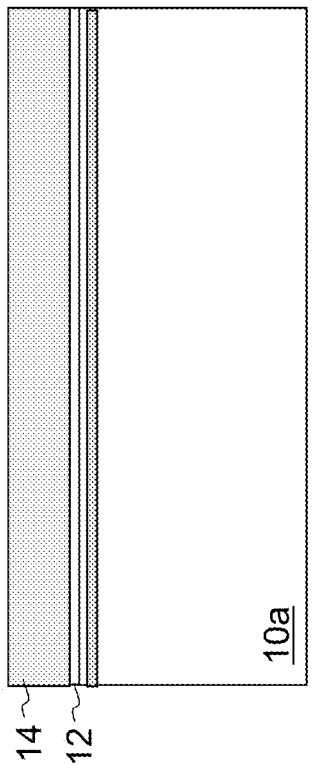
Figure 2B:
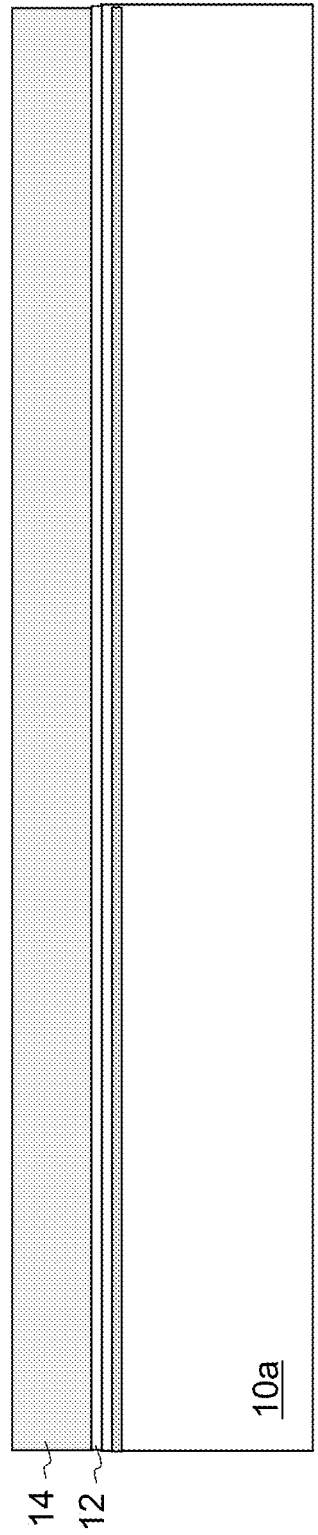
Figure 2C:
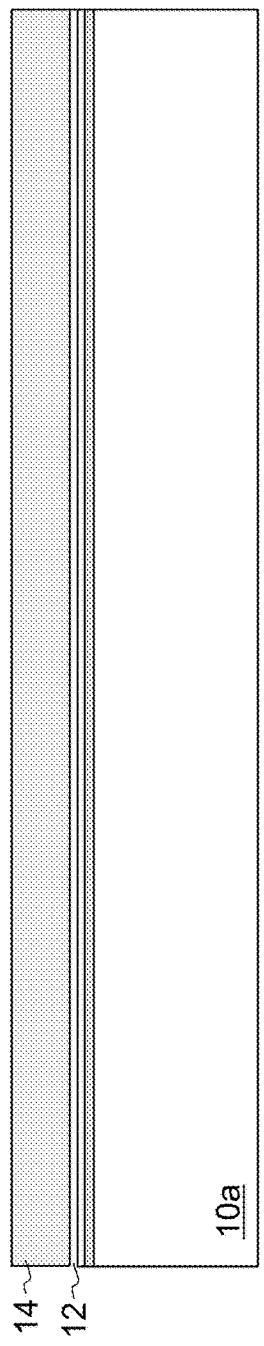
Figure 2D:
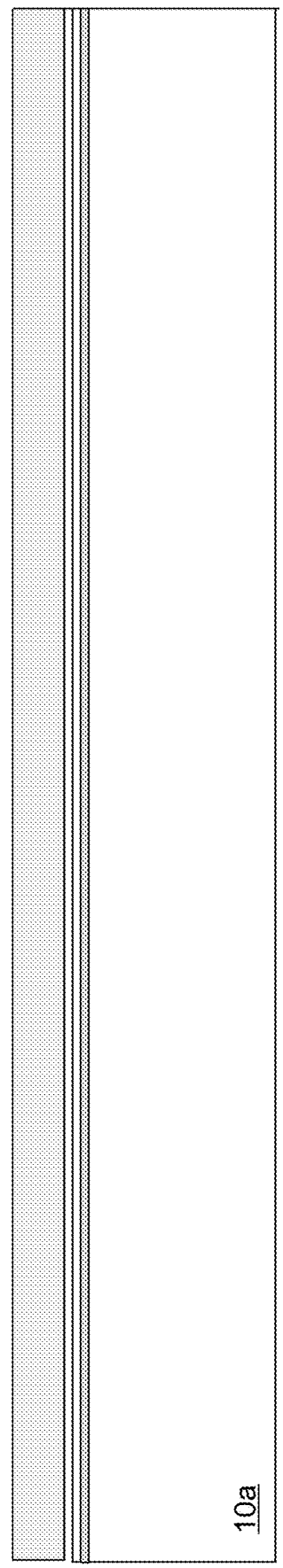
Figure 3A:
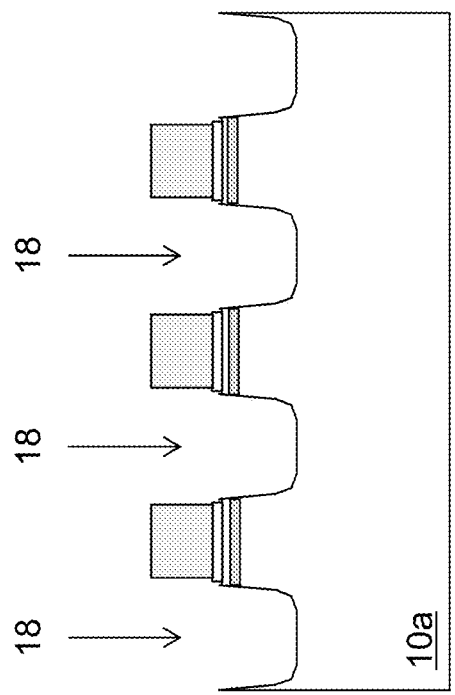
Figure 3B:
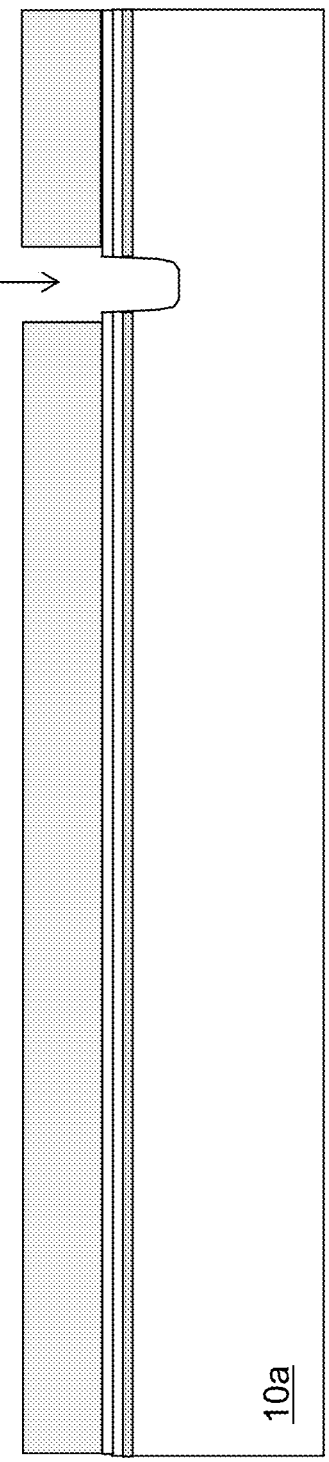
Figure 3C:
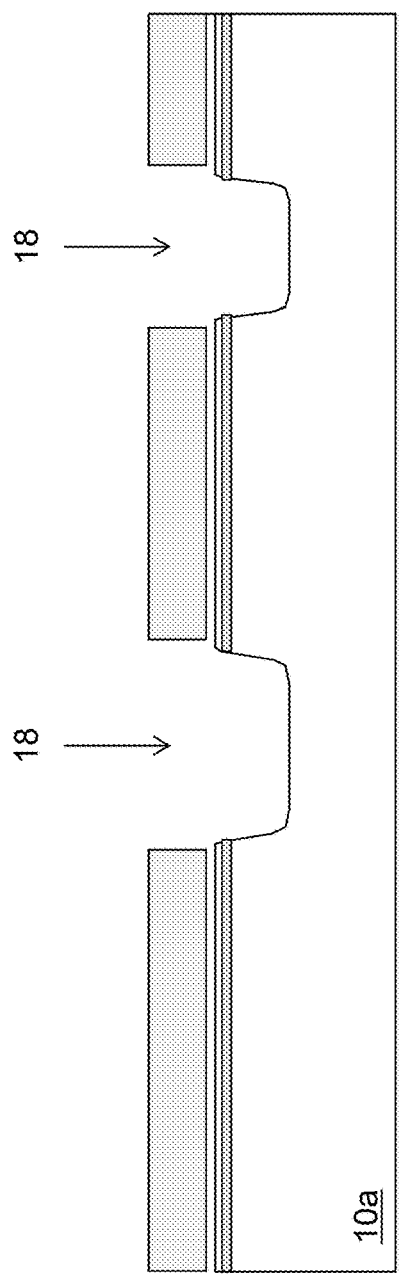
Figure 3D:
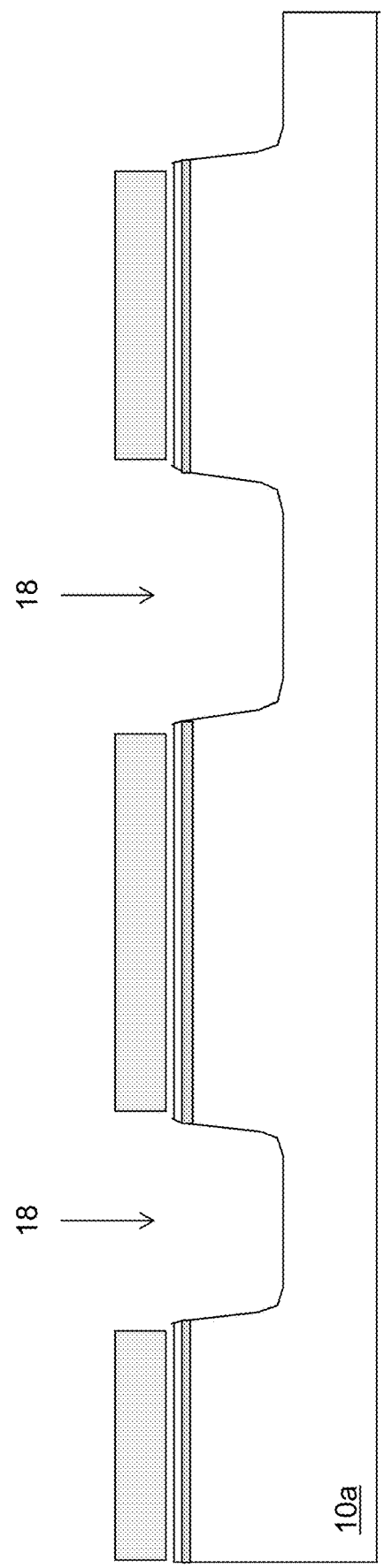
Figure 4A:
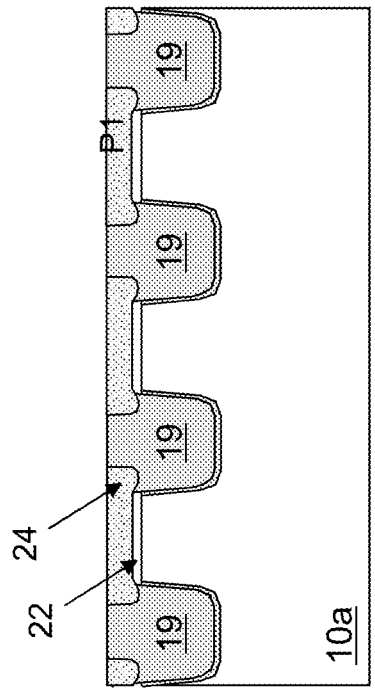
Figure 4B:
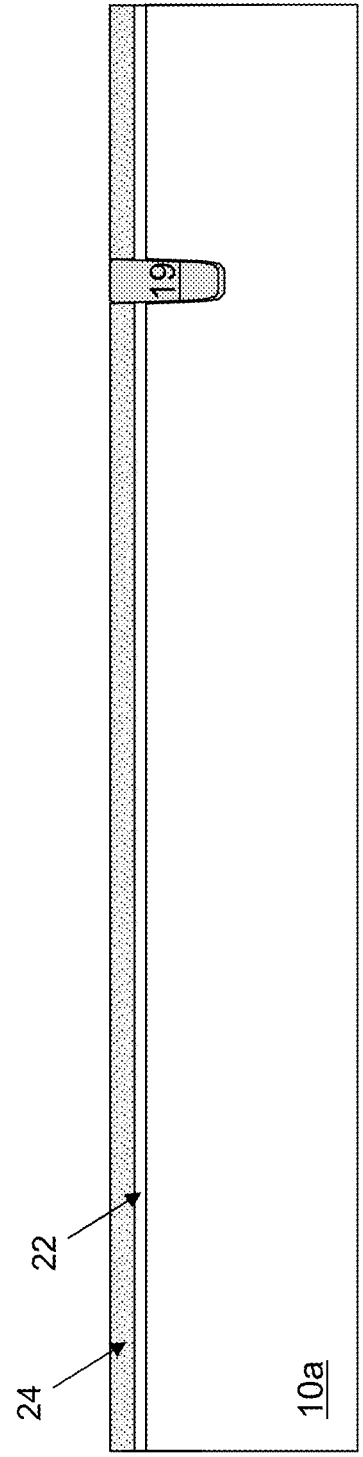
Figure 4C:
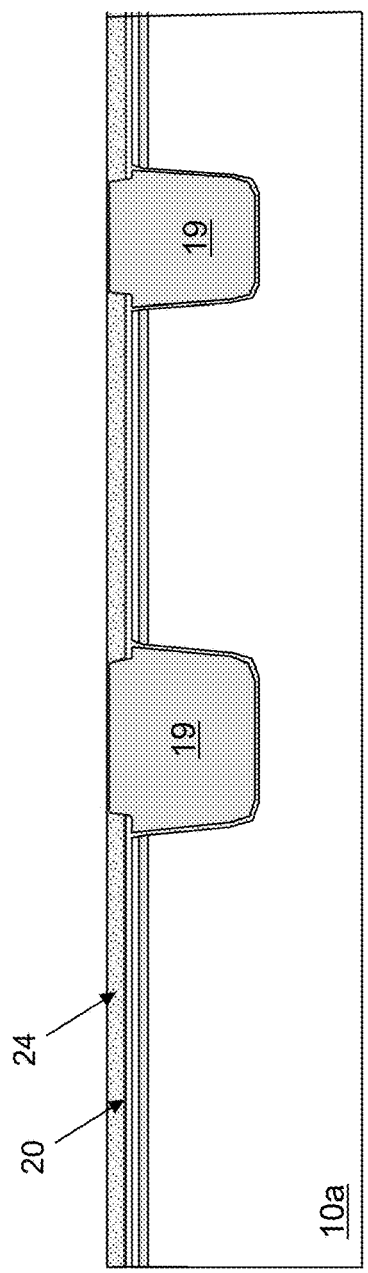
Figure 4D:
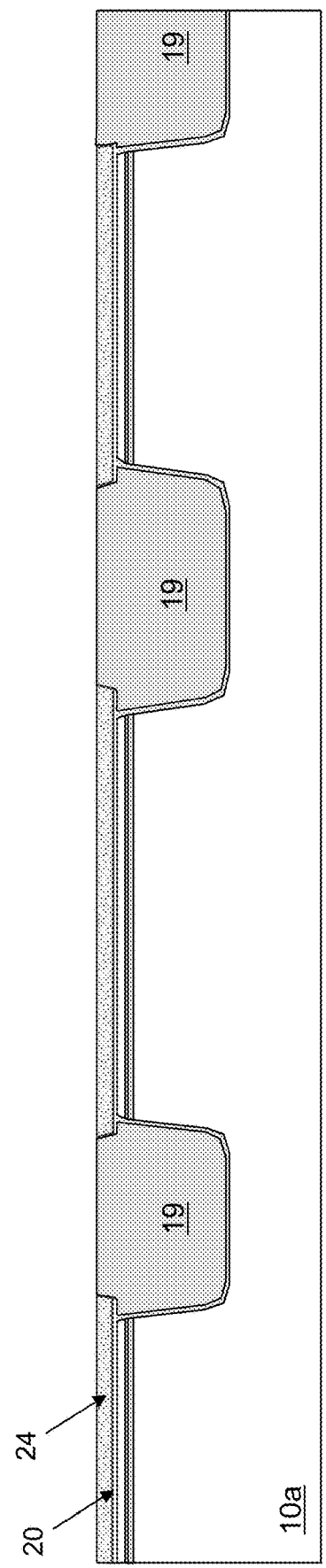
Figure 5A:
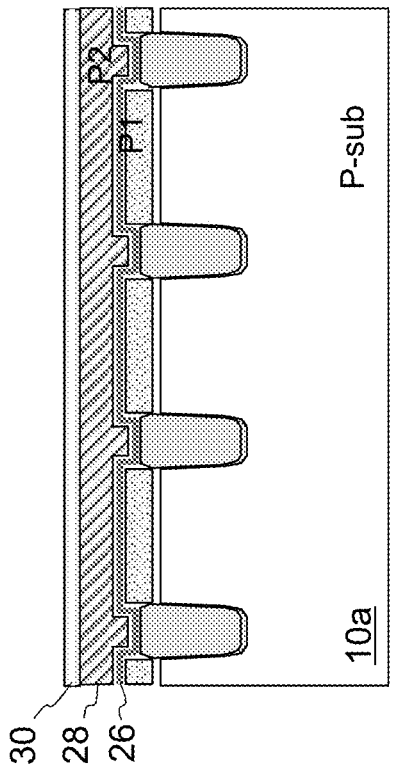
Figure 5B:
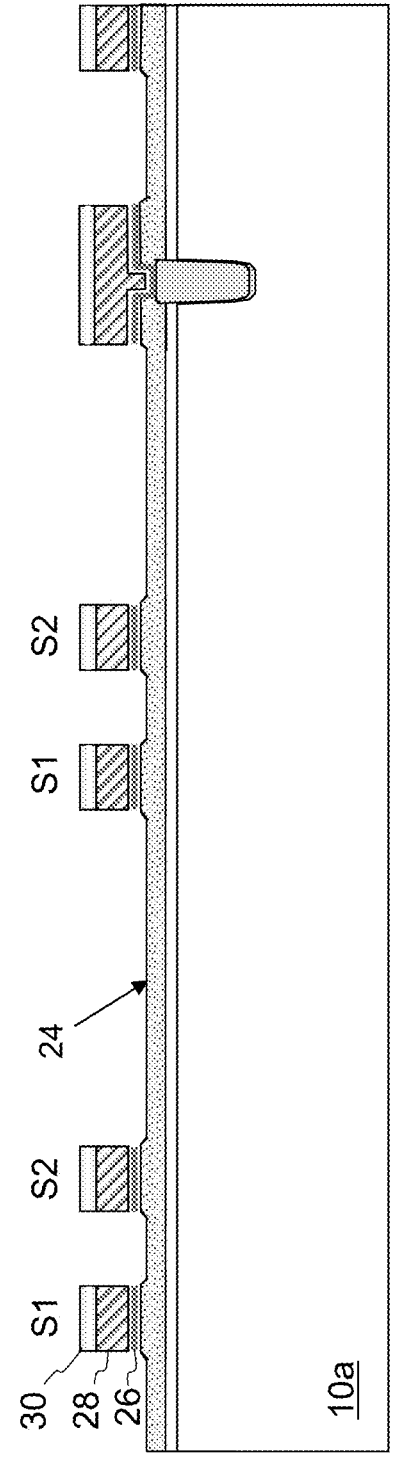
Figure 5C:
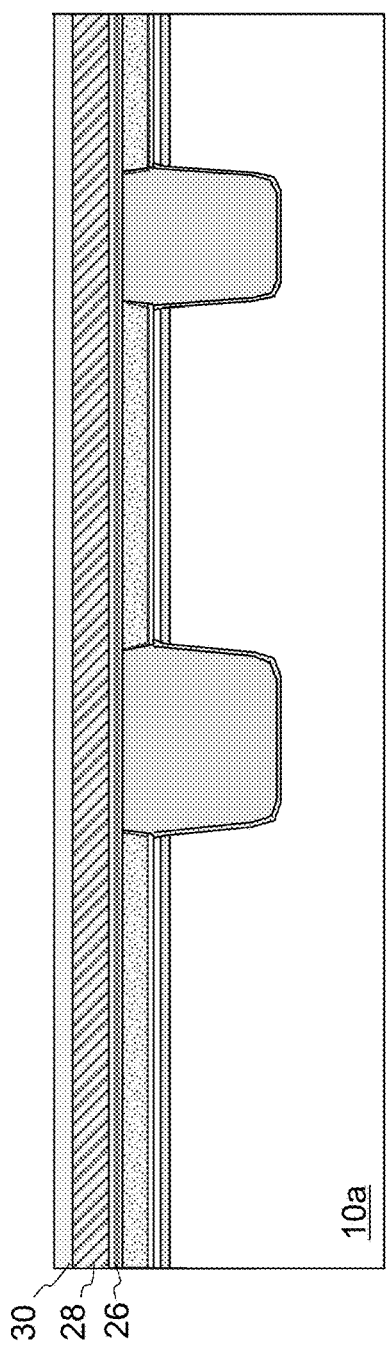
Figure 5D:
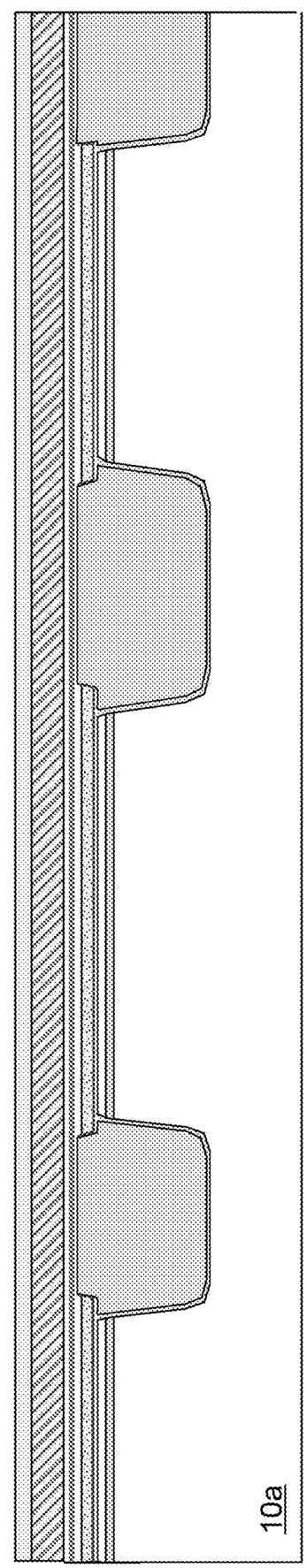
Figure 6A:
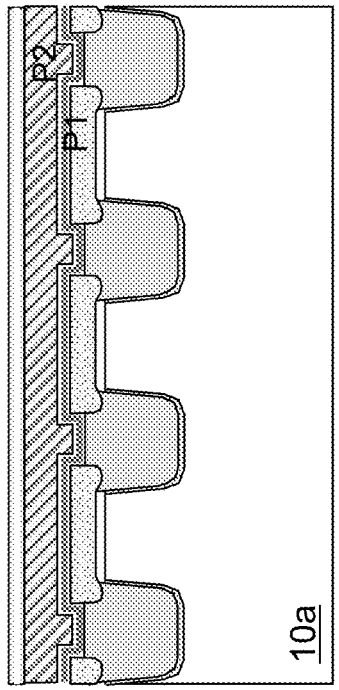
Figure 6B:
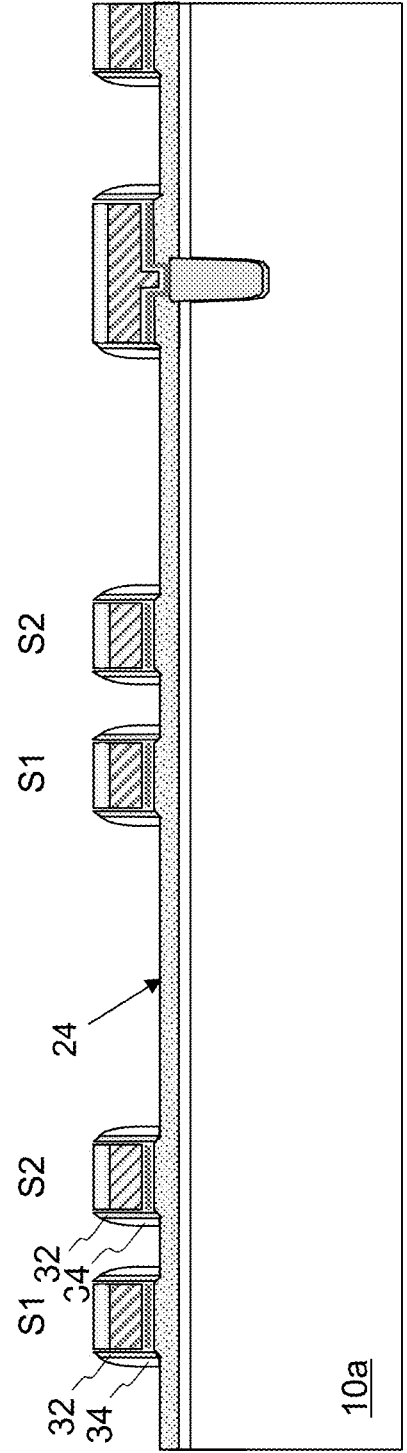
Figure 6C:
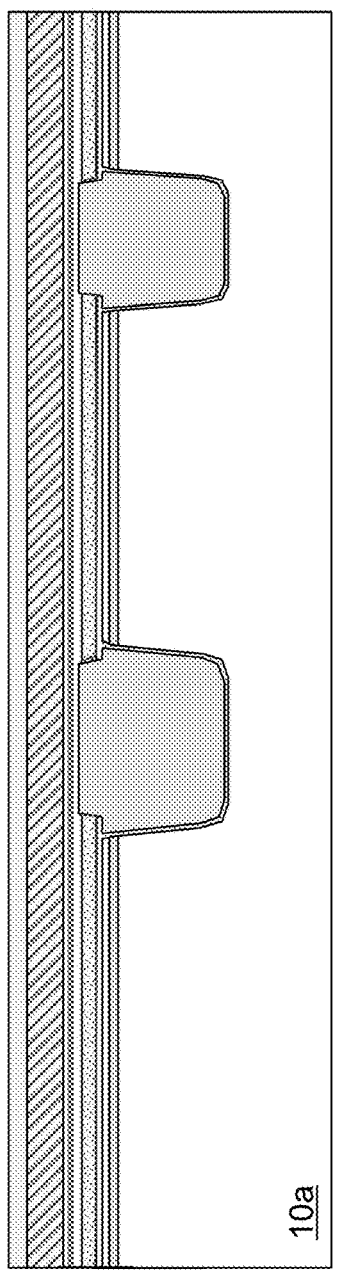
Figure 6D:
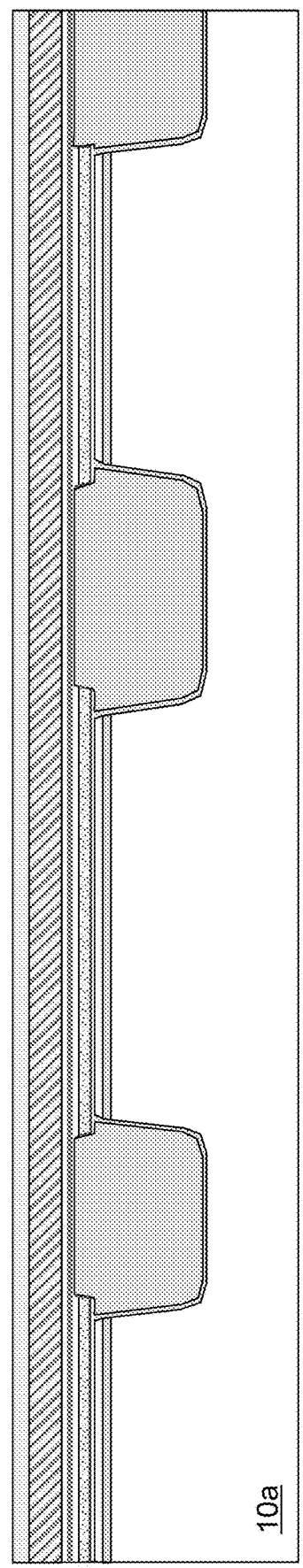
Figure 7A:
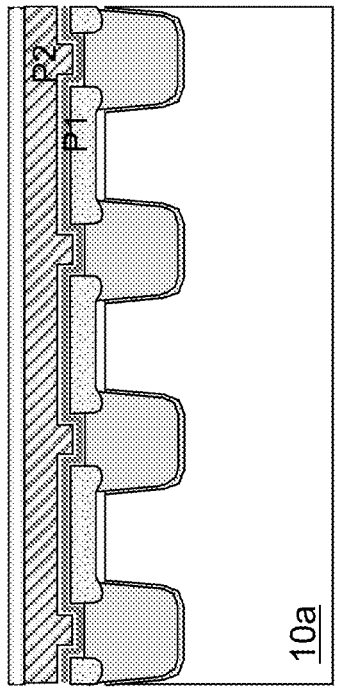
Figure 7B:
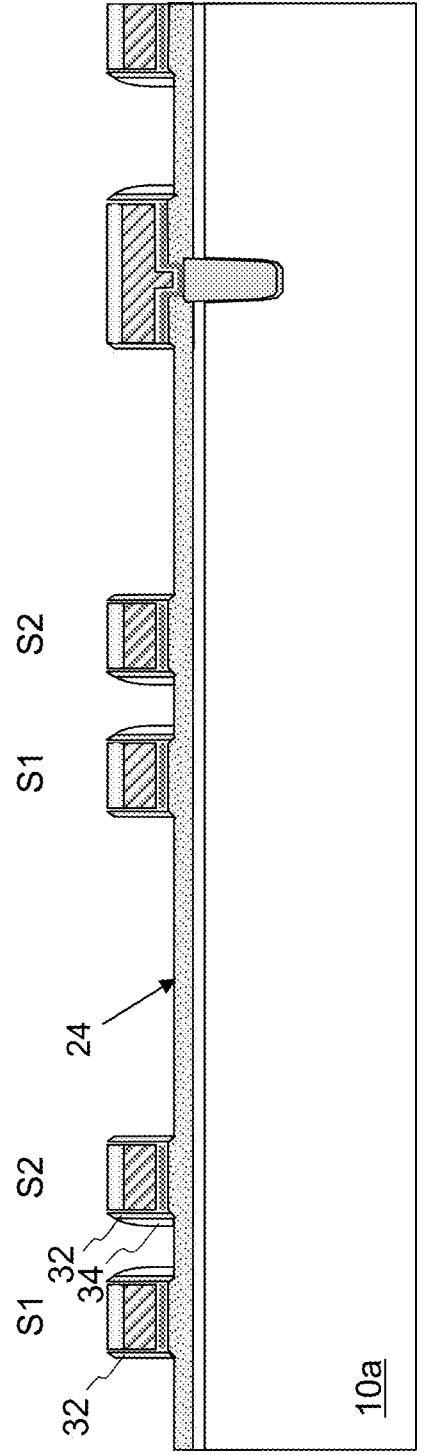
Figure 7C:
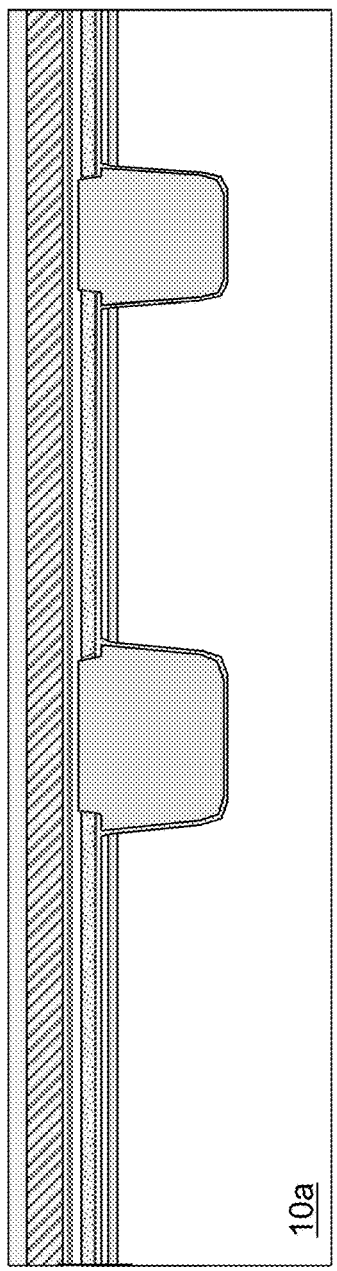
Figure 7D:
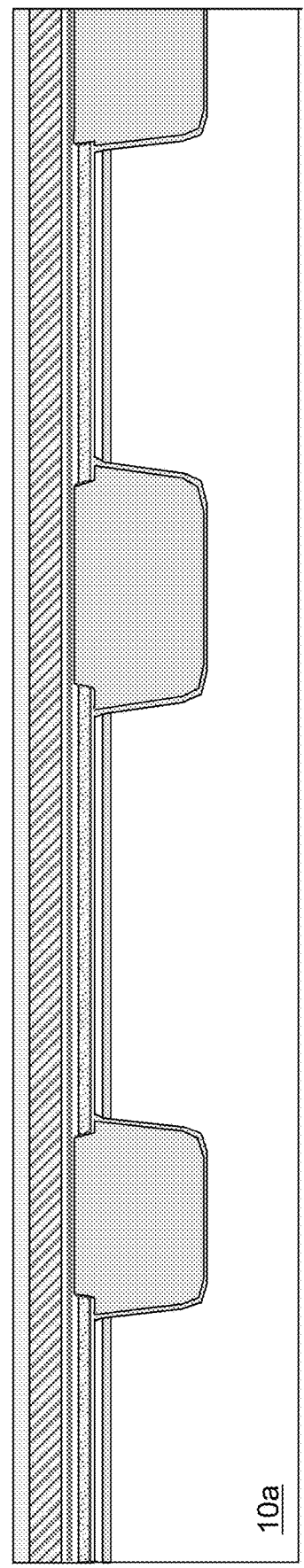
Figure 8A:
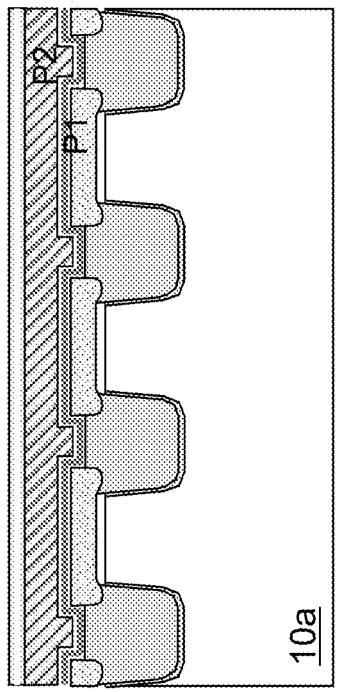
Figure 8B:
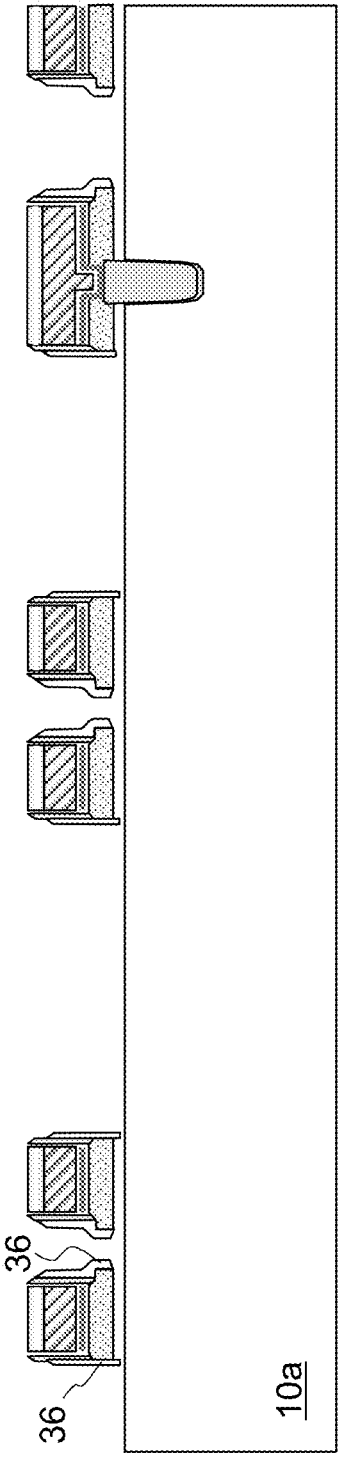
Figure 8C:
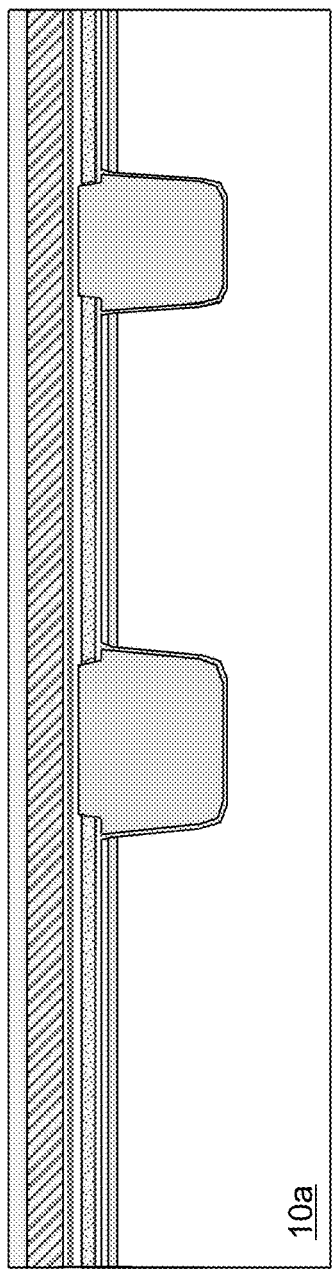
Figure 8D:
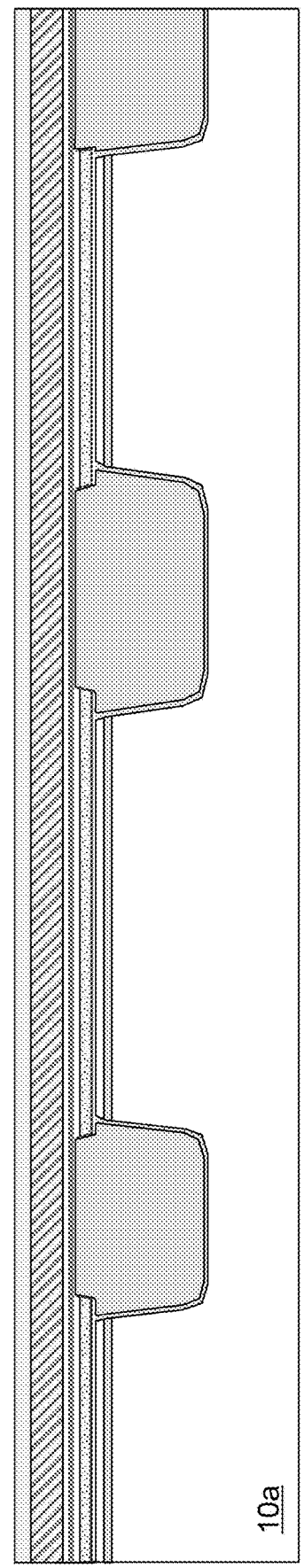
Figure 9C:
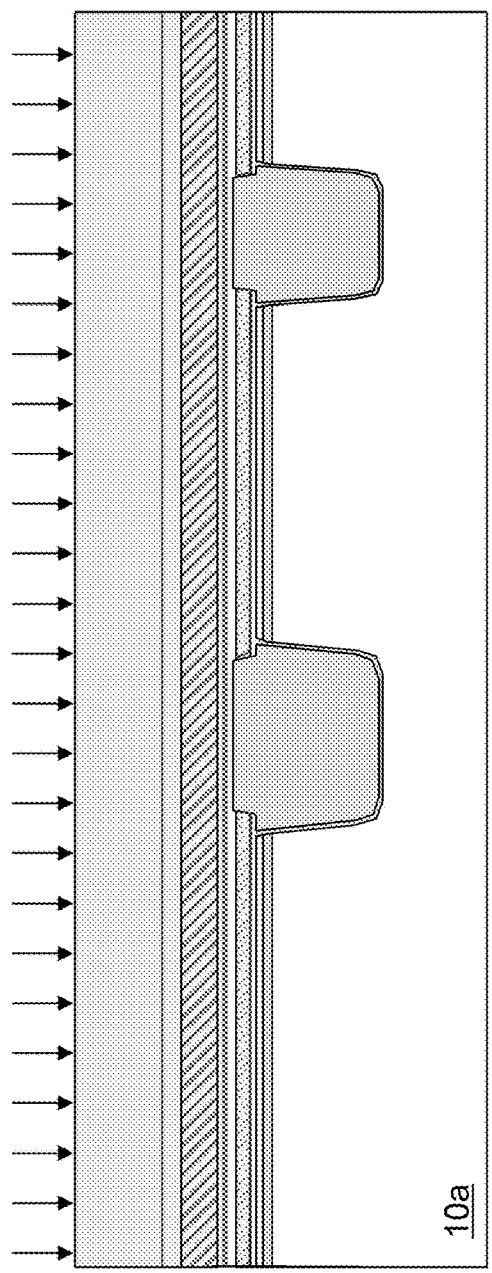
Figure 9D:
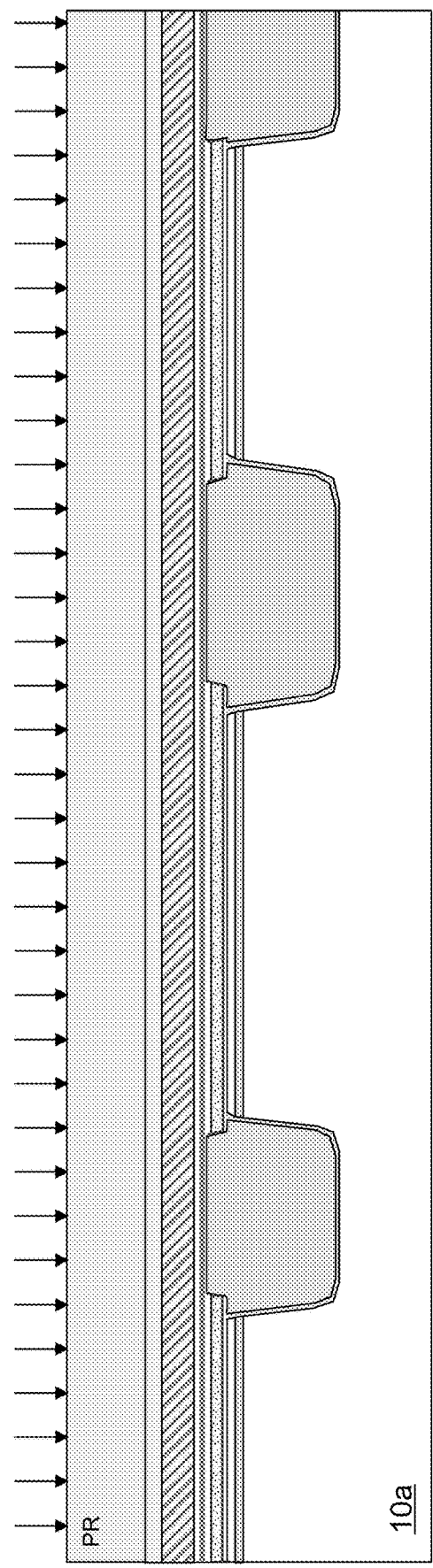
Figure 10A:
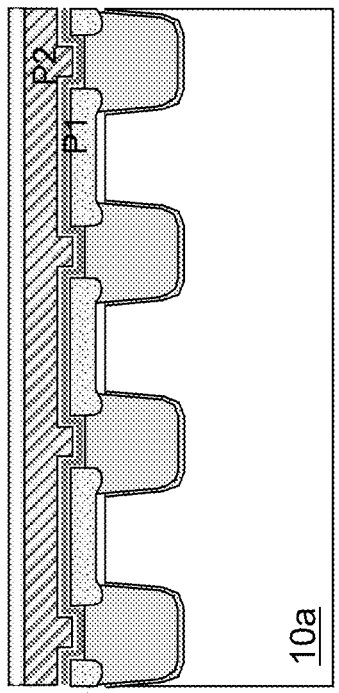
Figure 10B:
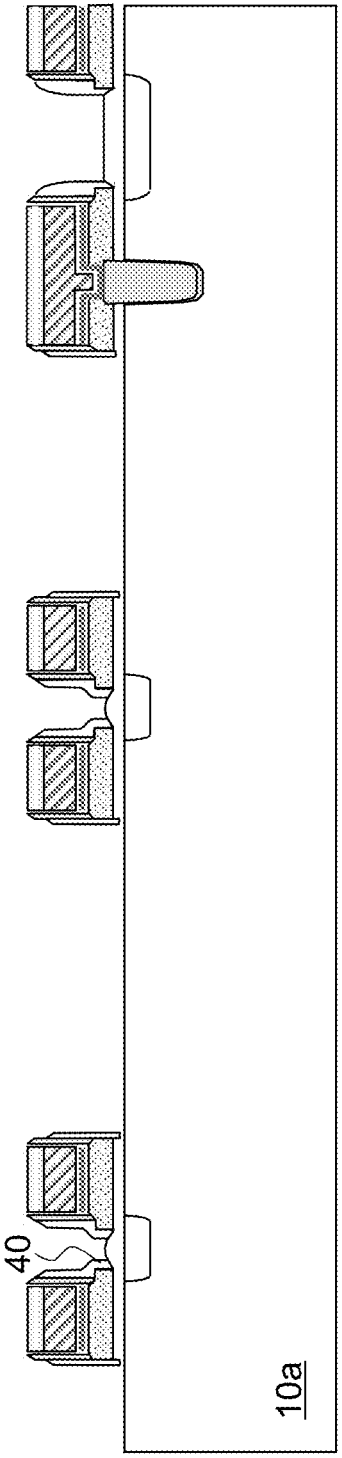
Figure 10C:
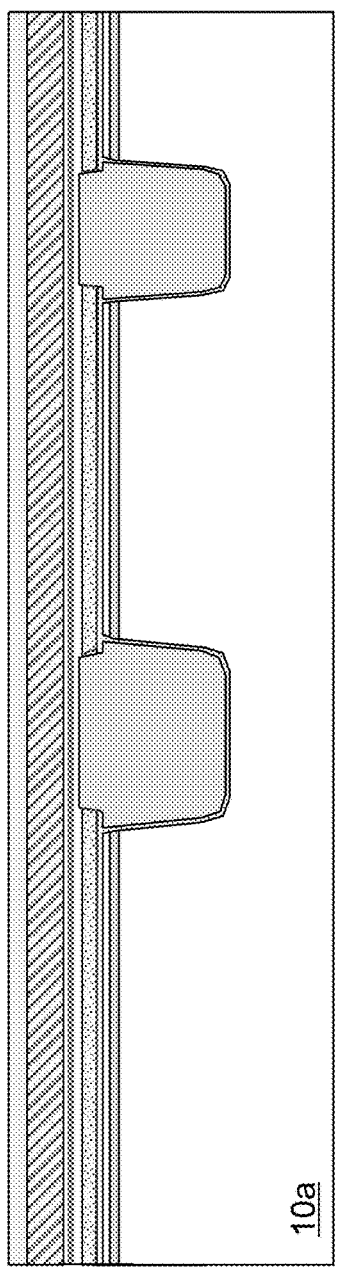
Figure 10D:
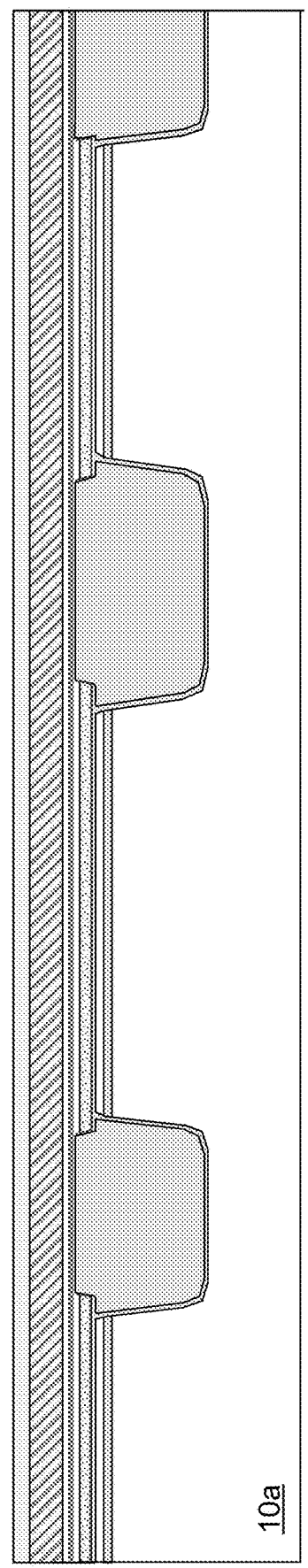
Figure 11A:
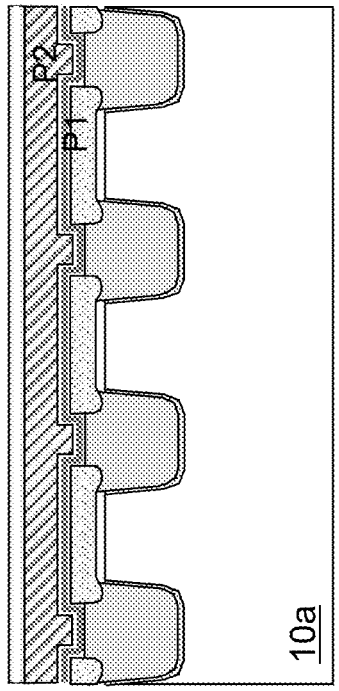
Figure 11B:
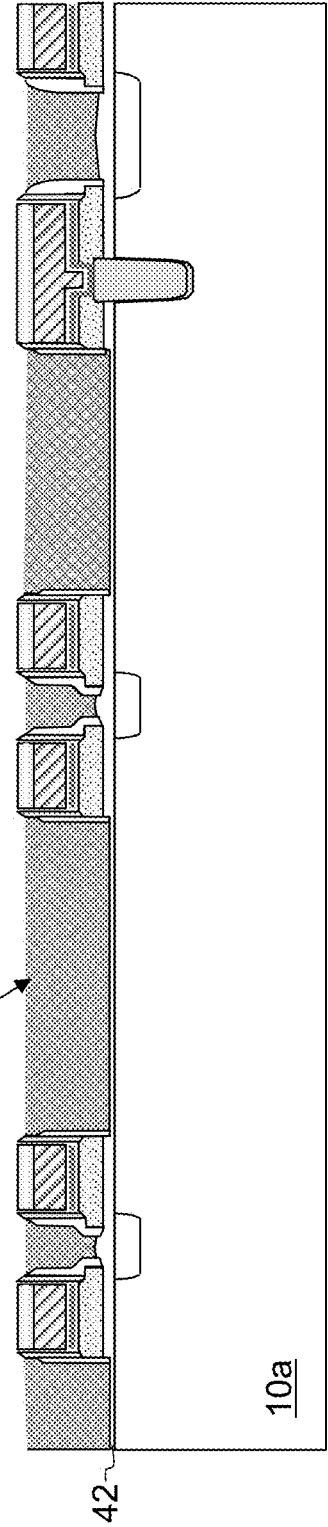
Figure 11C:
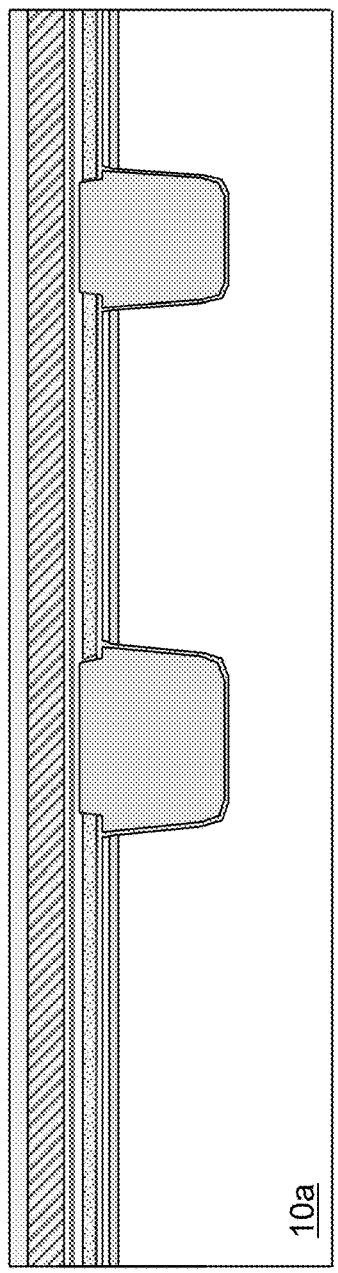
Figure 11D:
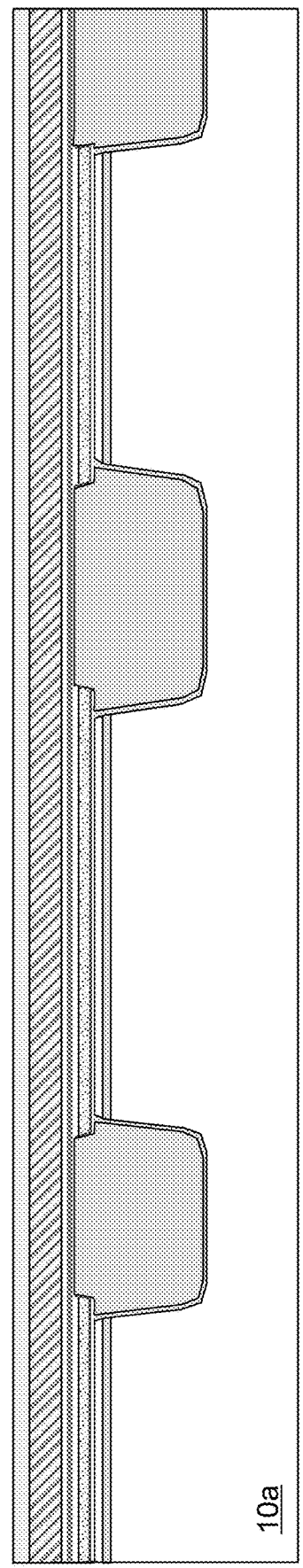

A silicon dioxide (oxide) layer 12 is formed on the silicon layer 10c. A silicon nitride (nitride) layer 14 is formed on the oxide layer 12. The resulting structures are shown in FIGS. 2A-2D. FIG. 2A is a cross sectional view of the memory area (in which the memory cells are being formed), in the control gate (CG) direction (the direction along which the control gate lines will extend). FIG. 2B is a cross sectional view of the memory area, in the bit line BL direction (the direction along which the bit lines will extend). FIGS. 2C and 2D are cross sectional views of the first and second logic areas (in which the logic devices are being formed).

A photolithography masking process is performed which includes forming a photo-resist material on nitride layer 14, followed by selectively exposing the photo-resist material to light using an optical mask, which is followed by selectively removing portions of the photo-resist material to expose portions of the underlying material (nitride layer 14 in this case). One or more etch processes are performed to create trenches 18 through the nitride and oxide layers 14/12, through the silicon layer 10c, through the insulation layer 10b, and into the bulk silicon 10a. The resulting structure is shown in FIGS. 3A-3D (after photo-resist removal).

The trenches 18 are filled with oxide 19 (STI oxide) by oxide deposition and chemical mechanical polish (CMP). A nitride etch is then used to remove nitride layer 14. An ONO (oxide-nitride-oxide) layer 20 is formed on oxide layer 12 in the logic areas. The logic areas are covered with photo resist, and oxide/nitride/silicon etches are performed to remove ONO layer 20, oxide layer 12, silicon layer 10c, and oxide layer 10b from the memory area, exposing the bulk silicon 10a. An oxide layer 22 (FG gate oxide) is formed on the bulk silicon 10a. After photoresist removal, a polysilicon deposition, implant, anneal and CMP is performed to form poly layer 24 (FG poly) on oxide layer 22 in the memory area and on ONO layer 20 in the logic areas, as shown in FIGS. 4A-4D. While poly layer 24 is disclosed and shown as being formed after the STI oxide 19, it should be noted that poly layer 24 can instead be formed first, and then the trenches 18 are formed through the poly layer 24 and filled with the STI oxide 19.

An ONO layer 26 is formed on poly layer 24. A poly layer 28 is formed on the ONO layer 26 by polysilicon deposition, implant and anneal. An insulation layer 30 is formed on poly layer 28. A masking process is performed to cover the structure with photo resist, and selectively remove portions of the photo resist to expose portions of layer 30 in the memory area only. An etch is used to remove exposed portions of layer 30, exposing portions of poly layer 28 in the memory area only. After photo resist removal, one or more etches are performed to remove exposed portions of poly layer 28 and ONO layer 26 in the memory area only, leaving pairs of spaced apart stack structures S1 and S2 of insulation 30, poly 28, and insulation 26. The upper surface of poly layer 24 is etched as well, leaving portions of the upper surface sloping upwardly as they approach stacks S1 and S2. Layer 30, poly layer 28 and ONO layer 26 remain intact in the logic areas. The resulting structures are shown in FIGS. 5A-5D.

A nitride deposition and etch are used to form spacers 32 along the sides of stacks S1 and S2 in the memory area. An oxide deposition and etch are used to forms spacers 34 along the sides of nitride spacers 32, as shown in FIGS. 6A-6D. Photo resist in formed over the area between each of the pair of stacks S1 and S2 (referred to herein as the inner stack area) and over the logic areas, but leaving exposed the area outside of each of the pair of stacks S1 and S2 (i.e., the area between each pair of stacks S1/S2, referred to herein as the outer stack area). An oxide etch is used to remove the oxide spacers in the 34 in the outer stack areas. The resulting structure is shown in FIGS. 7A-7D (after photo resist removal). The processing steps shown in FIGS. 6A-6D and 7A-7D are optional.

A poly etch is performed to remove the exposed portions of poly layer 24, so that each spaced apart stack structure S1/S2 includes poly 24 as well. Oxide spacers 36 are formed on the exposed ends of the poly layer 24 by oxide deposition, and oxide anisotropic etch, as shown in FIGS. 8A-8D. The structure is covered with photo resist PR except for the inner stack areas. An implantation process is performed to form source regions 38 in the substrate between the stacks S1 and S2, as shown in FIGS. 9A-9D. A wet etch is used to remove oxide spacers 36 in the inner stack areas. After photo resist removal, a tunnel oxide 40 is formed on the exposed portions of poly layer 24 in the inner stack area by oxide formation. A masking step is used to cover the inner stack areas with photo resist, and an oxide etch is used to remove exposed oxide in the outer stack areas. The resulting structure is shown in FIGS. 10A-10D (after photo resist removal).

An oxide layer (WL oxide) 42 is formed on the exposed substrate surface portions in the outer stack areas. A poly layer 44 is formed over the structure by polysilicon deposition. A poly CMP and/or poly etch back process is used to planarize and recess the poly layer 44 upper surface below the tops of stacks S1 and S2, and to remove the poly layer from the logic areas, as shown in FIGS. 11A-11D. This completes the majority of the memory cell formation.

Figure 12A:
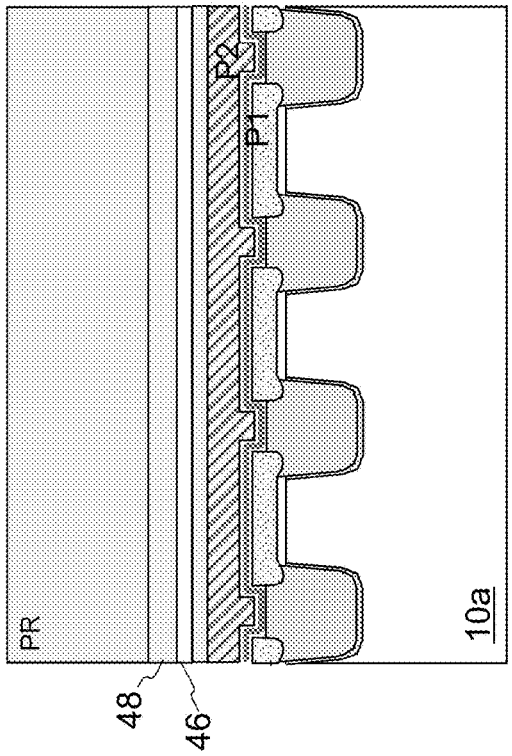
Figure 12B:
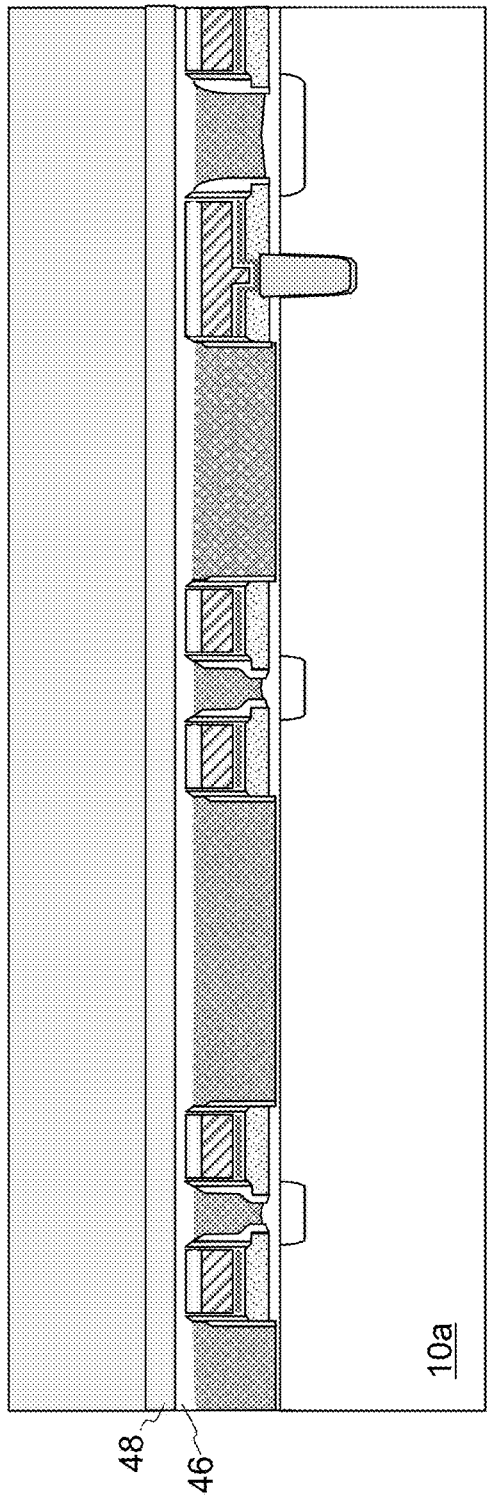
Figure 12C:
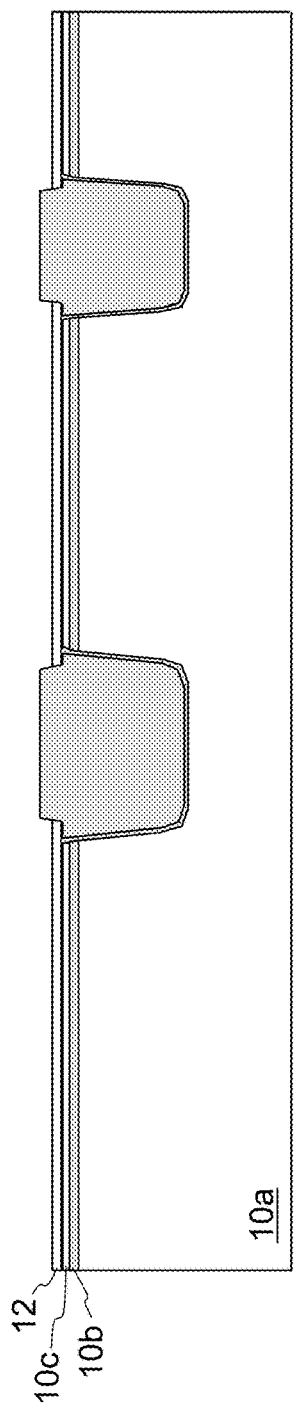
Figure 12D:
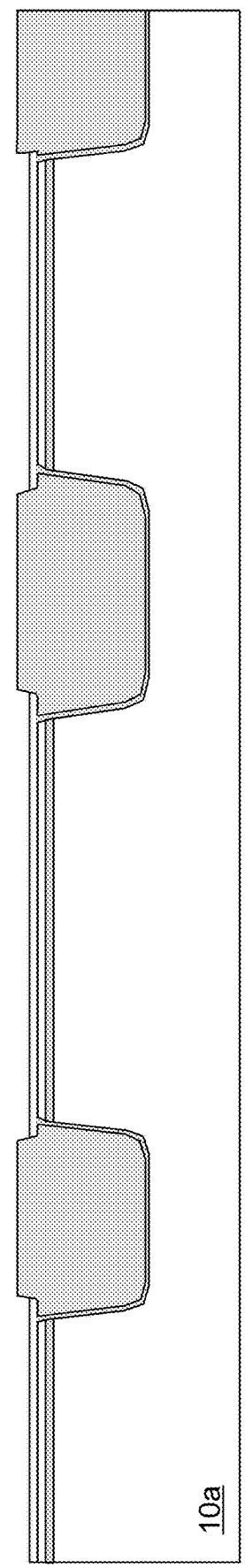
Figure 13A:
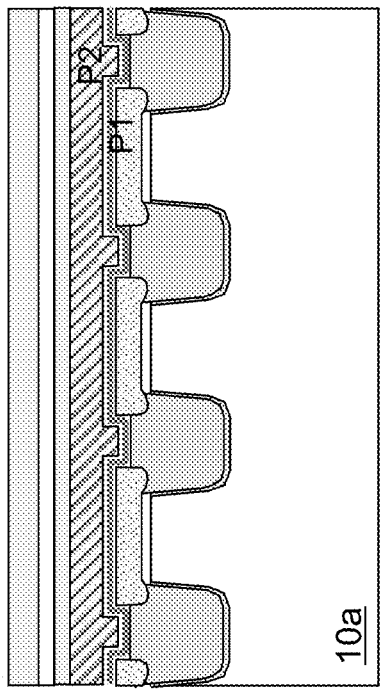
Figure 13B:
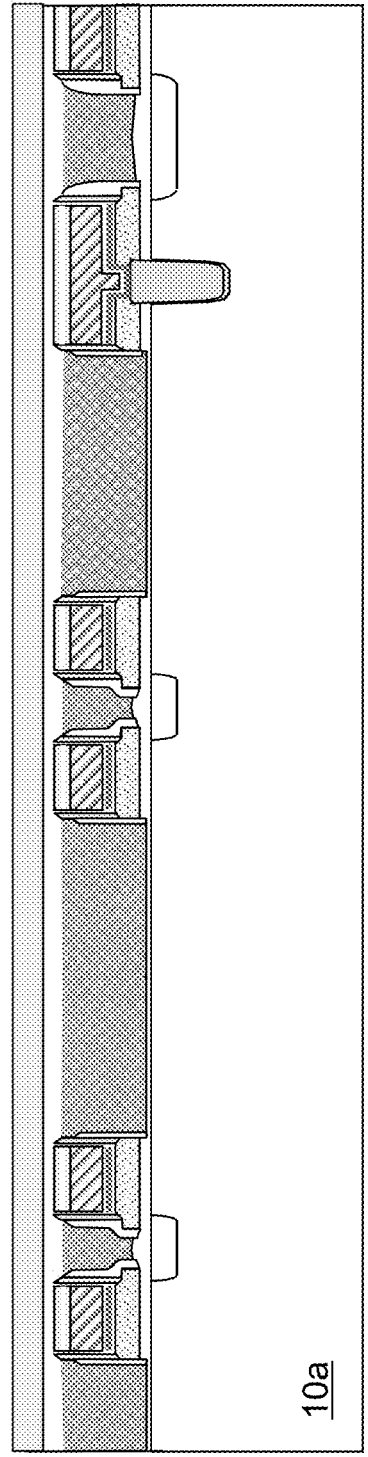
Figure 14A:
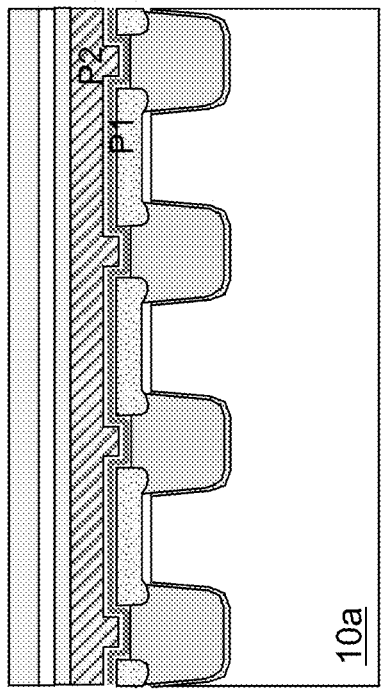
Figure 14B:
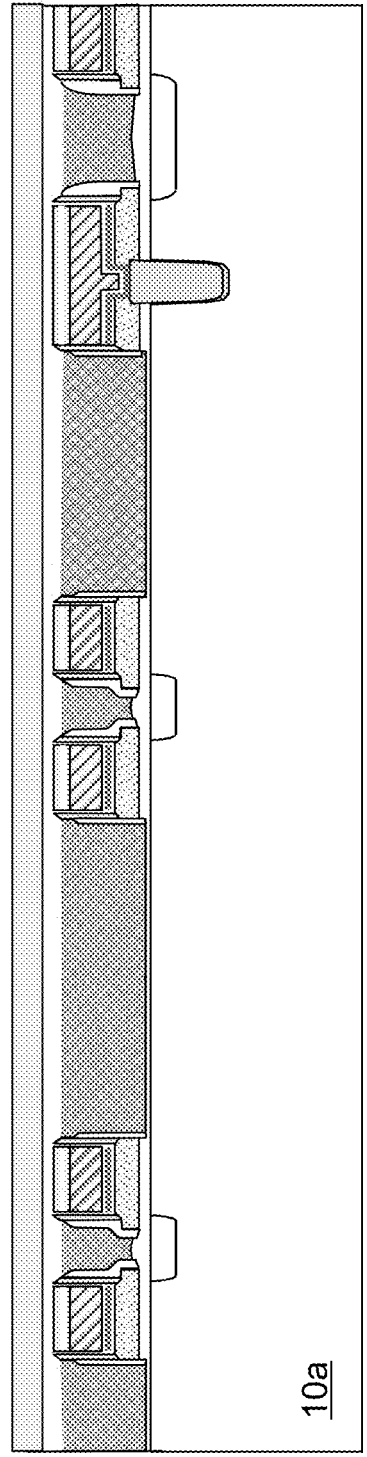
Figure 14C:
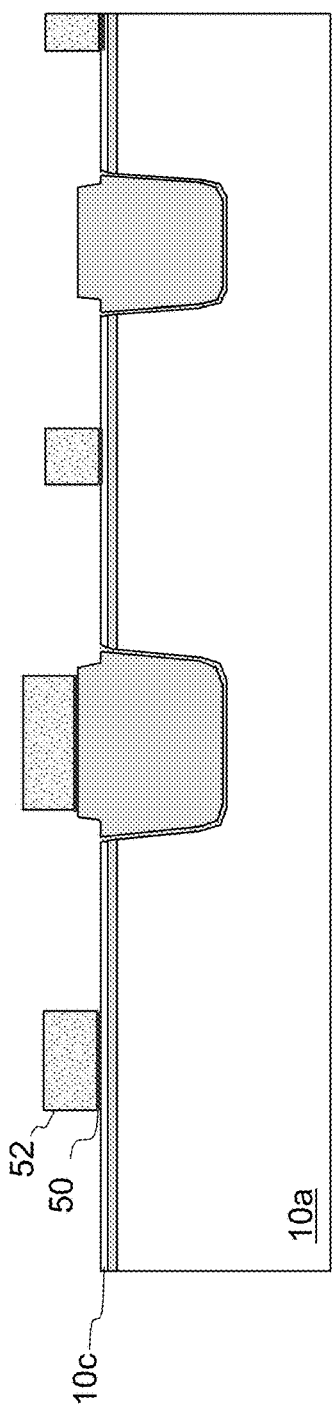
Figure 14D:
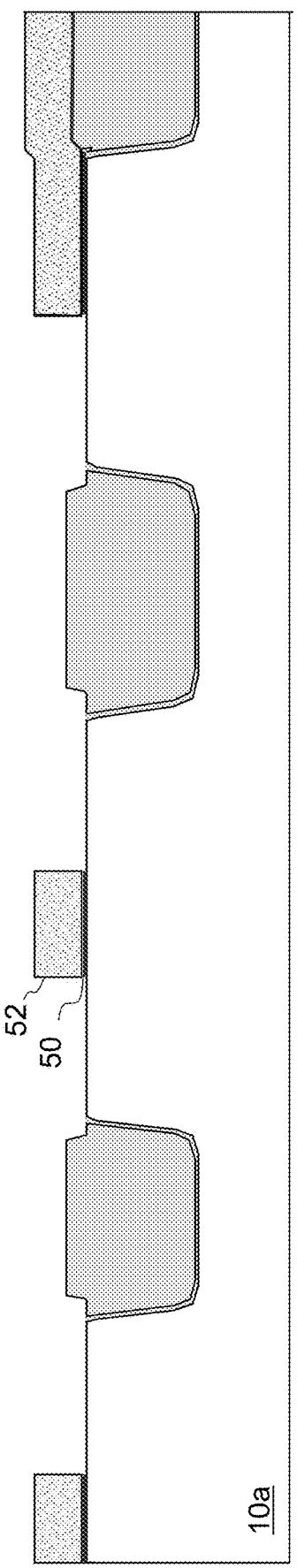
Figure 15A:
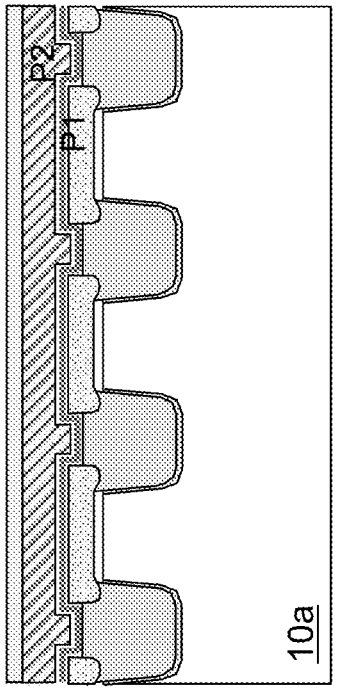
Figure 15B:
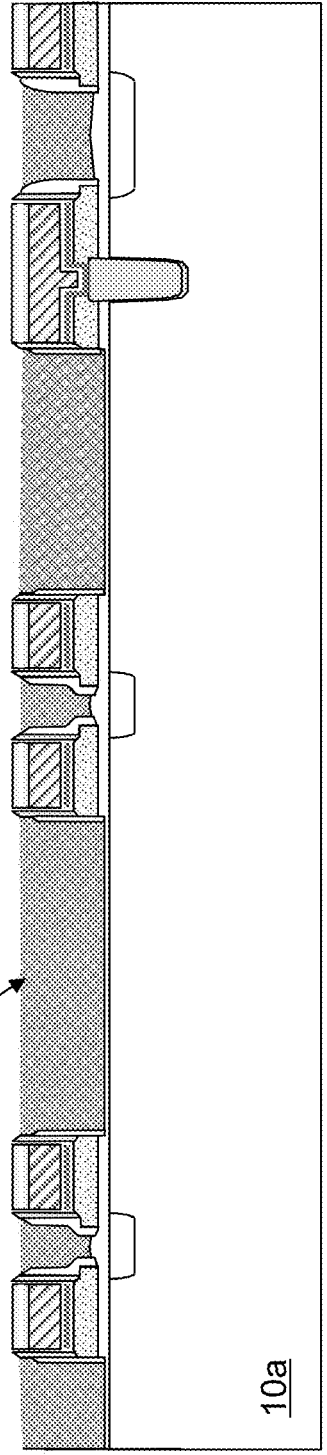
Figure 15C:
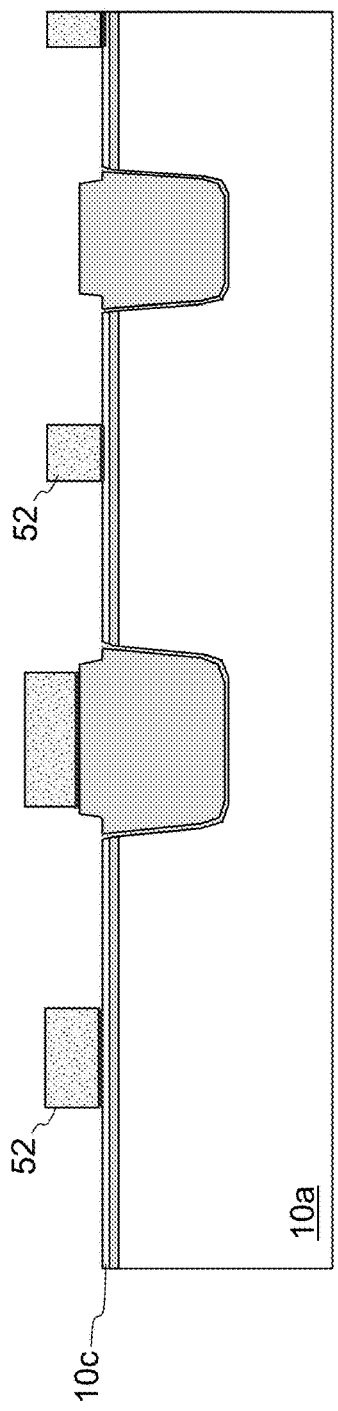
Figure 15D:
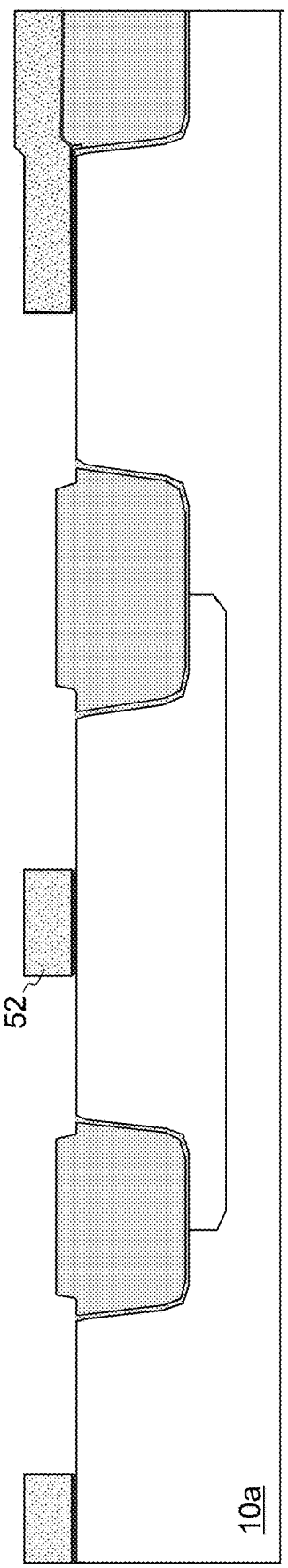

One or more layers are formed over the structure such as oxide 46 and/or nitride 48. Photo resist PR is formed in the memory area but not on the logic areas (i.e., the photoresist is removed from the logic areas). A series of etches are then performed to remove all the layers of material above the oxide layer 12 in the logic areas, as shown in FIGS. 12A-12D. A masking step is performed to cover the first logic area with photo resist PR (FIG. 12C) but not the second logic area (FIG. 12D). One or more etches are performed to remove oxide layer 12, silicon layer 10c and oxide layer 10b from the second logic area, leaving the bulk silicon 10a exposed. The resulting structure is shown in FIGS. 13A-13D. After photo resist removal, a series of implants can be performed for different portions of the logic areas. An oxide etch is next used to remove oxide layer 12 from the first logic area, exposing silicon layer 10c. A HKMG logic process is then used to form metal gates over a high k insulation layer. Specifically, this process includes forming a layer of high K insulator material 50 over the structure. A high K insulation material is insulation material having a dielectric constant K greater than that of oxide, such as $HfO_2$, $ZrO_2$, $TiO_2$, $Ta_2O_5$, or other adequate materials, etc. A layer of metal material such as aluminum, Ti, TiAlN, TaSiN, etc., is formed over the high K material layer 50. A masking step is performed to selectively cover portions of the metal layer with photo resist, whereby exposed portions of the metal material and high K insulator are removed by one or more etches, leaving blocks 52 of the metal material on thin blocks (strips) of high K insulator material 50 in the first and second logic areas, and leaving no such materials in the memory area, as shown in FIGS. 14A-14D. This completes the majority of the logic device formation.

A masking step is used to cover the logic areas with photo resist, and nitride and oxide etches are used to remove the nitride layer 48 and oxide layer 46 in the memory area, exposing poly layer 44, as shown in FIGS. 15A-15D (after photo resist removal). A masking step is used to cover the logic areas and the memory area except for portions of the structure between adjacent pairs of stacks S1 and S2 (outer stack areas). A poly etch is then used to remove the exposed portions of poly layer 44, leaving poly blocks 44a in the outer stack areas. One or more implantation processes are performed to form drain regions 54 in the bulk substrate 10 adjacent the poly blocks 44a in the memory area, and source and drain regions 56 and 58 in the bulk substrate 10a or silicon layer 10c adjacent the metal blocks 52 in the logic areas, as shown in FIGS. 16A-16D (after photo resist removal).

Figure 16A:
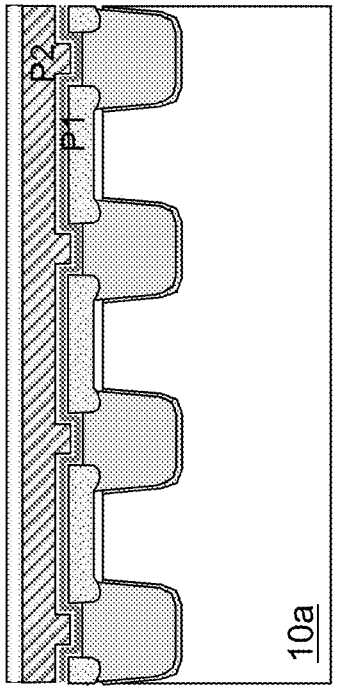
Figure 16B:
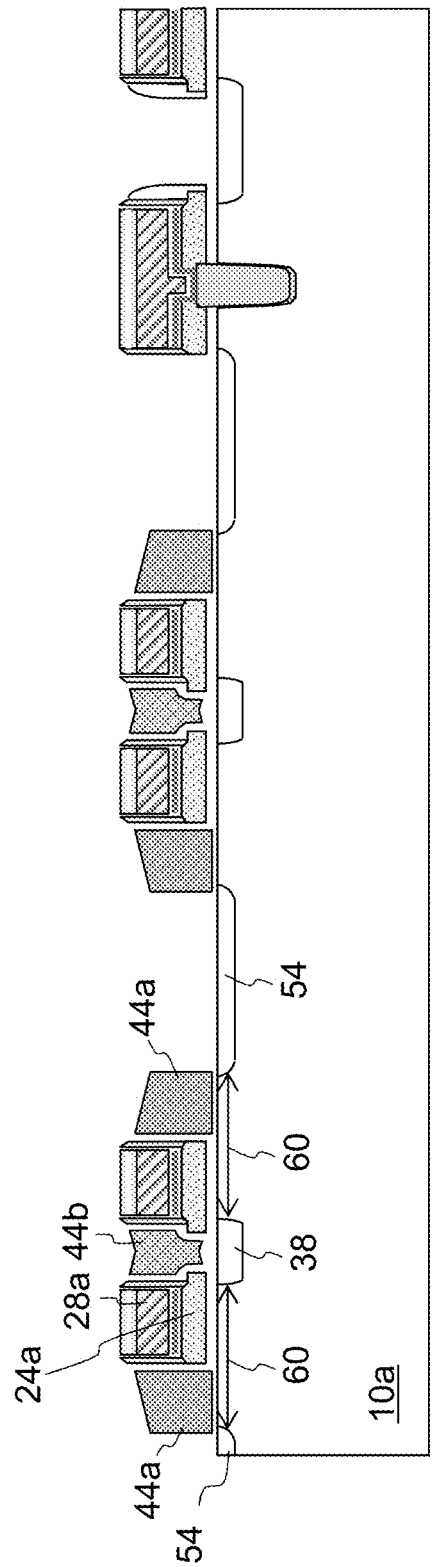

The final memory cell structure shown in FIGS. 16A-16B includes pairs of memory cells each sharing a source region 38 spaced apart from two drain regions 54, with channel regions 60 in the bulk silicon 10a extending there between. Each memory cell includes a floating gate 24a disposed over and insulated from a first portion of the channel region 60 for controlling the conductivity thereof, a select gate 44a disposed over and insulated from a second portion of the channel region 60 for controlling the conductivity thereof, a control gate 28a disposed over and insulated from the floating gate 24a, and an erase gate 44b disposed over and insulated from the source region 38 (shared by the pair of memory cells). The pairs of memory cells extend in the column direction (BL direction), and columns of the memory cells are formed, with insulation 19 between adjacent columns. A row of the control gates are formed as a continuous control gate line that connects the control gates together for an entire row of the memory cells. A row of the select gates are formed as a continuous select gate line that connects the select gates together for an entire row of the memory cells. A row of the erase gates are formed as a continuous erase gate line that connects the erase gates together for an entire row of pairs of the memory cells.

Figure 16C:
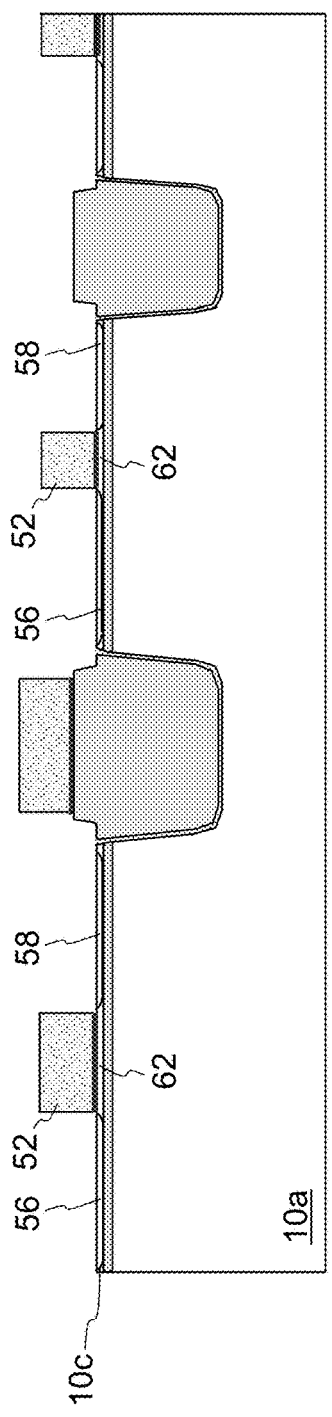
Figure 16D:
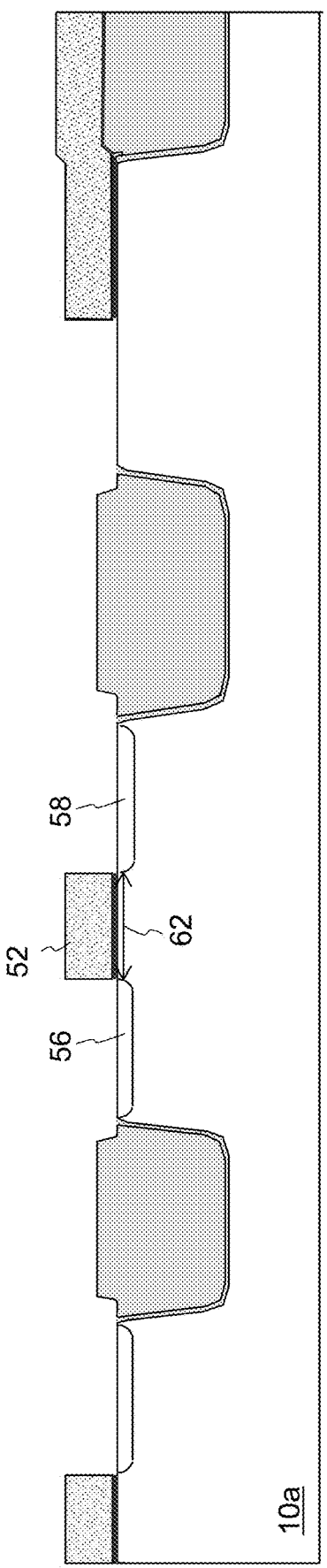

The final logic devices are shown in FIGS. 16C and 16D. In the first logic area of FIG. 16C, each logic device includes spaced apart source and drain regions 56 and 58 in the silicon layer 10c with a channel region 62 of the silicon layer 10c extending there between, and a metal gate 52 disposed over and insulated from the channel region 62 for controlling the conductivity thereof. In the second logic area of FIG. 16D, each logic device includes spaced apart source and drain regions 56 and 58 in the bulk silicon substrate 10a, and a metal gate 52 disposed over and insulated from the channel region 62 for controlling the conductivity thereof.

There are a number of advantages of the above described method of forming memory cells and logic devices on the same substrate. First, memory cells formed on bulk silicon, logic devices formed on the bulk silicon and logic devices formed on a thin silicon layer over insulation over the bulk silicon, are all formed together on the same substrate. Second, the memory cell stacks and select gate poly, including source region, are formed in the memory area before the logic devices are formed in the logic areas. And, the various oxide, nitride and poly layers used to form the gate stacks S1/S2 in the memory area are formed in the logic areas as well. Only after the memory cell stacks (and select gate poly) are formed, and the memory area protected by one or more protective layers (e.g., oxide 46 and/or nitride 48), are the oxide, nitride and poly layers used to form the memory cell stacks removed from the logic areas. Before they are removed, these layers protect the logic areas, and the bulk silicon and thin layer of silicon in particular, from processing steps used to form the memory cells which can adversely affect the logic areas of the substrate. Third, the inclusion in the logic areas of the oxide, nitride and poly layers used to form the memory stacks S1/S2 in the memory area better facilitates memory cell formation by maintaining structures in all areas of substantially equal height (e.g., equal height topology provides for more accurate CMP in the memory area). Fourth, during logic device formation, the memory area is protected by oxide and/or nitride layer 46 and 48, so the memory cell stacks are not adversely affected by the processing steps used to form the logic devices, including the formation of metal gates for the logic devices. Fifth, the above described formation process allows for the source and drain regions 38/54 of the memory cells and the source and drain regions 56 and 58 of the logic devices in the second logic area to extend deeper into bulk silicon 10a than do the source and drain regions 56/58 in silicon layer 10c in the first logic area. Sixth, the process also allows for the same polysilicon deposition process to form the erase and select gates 44b/44a in the memory area. Seventh, the logic device gates are formed of high K insulation and metal for better conductivity while the memory cell gates are formed of polysilicon for better performance and control. Eight, some of the logic devices are formed on SOI (i.e., first logic area), while other logic devices (i.e., second logic area) and the memory cells are formed on bulk silicon, which provides for logic devices of varying performance depending on their uses (high versus low voltage operation, etc.).

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the memory cell area and the logic areas of the present invention, unless otherwise specified in the claims. For certain applications, the second logic area and its logic devices could be omitted. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A method of forming a semiconductor device, comprising:
providing a substrate that includes bulk silicon, a first insulation layer directly over the bulk silicon, and a silicon layer directly over the first insulation layer;

removing the silicon layer and the first insulation layer from a first area of the substrate, while maintaining the first insulation layer and the silicon layer in a second area of the substrate;

forming a first polysilicon layer disposed over and insulated from the bulk silicon in the first area of the substrate and over and insulated from the silicon layer in the second area of the substrate;

forming a second polysilicon layer disposed over and insulated from the first polysilicon layer in the first and second areas of the substrate;

performing one or more etches to selectively remove portions of the first and second polysilicon layers in the first area of the substrate while maintaining the first and second polysilicon layers in the second area of the substrate, wherein the one or more etches result in pairs of spaced apart stack structures of the first and second polysilicon layers in the first area of the substrate;

forming first source regions in the bulk silicon in the first area of the substrate each disposed between one of the pairs of stack structures;

forming a third polysilicon layer disposed over and insulated from the bulk silicon in the first area of the substrate and disposed between the stack structures;

forming one or more protective layers in the first area of the substrate over the stack structures and the third polysilicon layer;

after the forming of the one or more protective layers in the first area of the substrate, removing the first and second polysilicon layers from the second area of the substrate;

after the removing of the first and second polysilicon layers from the second area of the substrate, forming logic devices in the second area of the substrate, wherein the forming of each of the logic devices includes:
  forming spaced apart second source and first drain regions in the silicon layer, and
  forming a conductive gate over and insulated from a portion of the silicon layer between the second source and first drain regions;

after the forming of the logic devices, removing the one or more protective layers in the first area of the substrate;

etching portions of the third polysilicon layer in the first area of the substrate to form a plurality of blocks of the third polysilicon layer each disposed adjacent to one of the stack structures; and forming second drain regions in the bulk silicon in the first area of the substrate, wherein each second drain region is disposed adjacent to one of the blocks of the third polysilicon layer.

2. The method of claim 1, wherein the first source and second drain regions extend deeper into the bulk silicon than do the second source and first drain regions into the silicon layer.

3. The method of claim 1, wherein the first source and second drain regions extend deeper into the bulk silicon than a thickness of the silicon layer.

4. The method of claim 1, wherein the conductive gates include a metal material.

5. The method of claim 4, wherein the conductive gates are insulated from the silicon layer by a high K insulation material.

* * * * *